US006967062B2

(12) United States Patent
Hatwar et al.

(10) Patent No.: US 6,967,062 B2
(45) Date of Patent: Nov. 22, 2005

(54) WHITE LIGHT-EMITTING OLED DEVICE HAVING A BLUE LIGHT-EMITTING LAYER DOPED WITH AN ELECTRON-TRANSPORTING OR A HOLE-TRANSPORTING MATERIAL OR BOTH

(75) Inventors: Tukaram K. Hatwar, Penfield, NY (US); Michele L. Ricks, Rochester, NY (US); Dustin Winters, Webster, NY (US); Jeffrey P. Spindler, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 23 days.

(21) Appl. No.: 10/606,446

(22) Filed: Jun. 26, 2003

(65) Prior Publication Data

US 2004/0185300 A1 Sep. 23, 2004

Related U.S. Application Data

(63) Continuation-in-part of application No. 10/391,727, filed on Mar. 19, 2003, now abandoned.

(51) Int. Cl.[7] ................................................ H05B 33/14

(52) U.S. Cl. ....................... 428/690; 428/917; 313/112; 313/504; 313/506; 257/88; 257/98

(58) Field of Search ................................ 428/690, 917; 313/504, 506, 112; 257/88, 98; 252/301.16

(56) References Cited

U.S. PATENT DOCUMENTS

2003/0170496 A1 * 9/2003 Hieda et al. ................ 428/690

FOREIGN PATENT DOCUMENTS

| | | |
|---|---|---|
| EP | 0 643 549 | 3/1995 |
| EP | 0 786 925 | 7/1997 |
| EP | 1 187 235 | 3/2002 |
| EP | 1 286 569 | 2/2003 |

OTHER PUBLICATIONS

Hamada et al., Applied Physics Letters, vol. 75, No. 12, pp. 1682–1684, (1999).*

* cited by examiner

*Primary Examiner*—Dawn L. Garrett
(74) *Attorney, Agent, or Firm*—Thomas H. Close

(57) ABSTRACT

An organic light-emitting diode (OLED) device which produces substantially white light includes an anode; a hole-transporting layer disposed over the anode; and a blue light-emitting layer having a host doped with a blue light-emitting compound disposed directly on the hole-transporting layer and the blue light-emitting layer being doped with an electron-transporting or a hole-transporting material or both selected to improve efficiency and operational stability. The device also includes an electron-transporting layer disposed over the blue light-emitting layer; a cathode disposed over the electron-transporting layer; and the hole-transporting layer or electron-transporting layer, or both the hole-transporting layer and electron-transporting layer, being selectively doped with a compound which emits light in the yellow region of the spectrum which corresponds to an entire layer or a partial portion of a layer in contact with the blue light-emitting layer.

36 Claims, 6 Drawing Sheets

WHITE LIGHT-EMITTING OLED DEVICE HAVING A BLUE LIGHT-EMITTING LAYER DOPED WITH AN ELECTRON-TRANSPORTING OR A HOLE-TRANSPORTING MATERIAL OR BOTH

CROSS REFERENCE TO RELATED APPLICATIONS

This is a continuation-in-part of application Ser. No. 10/391,727, filed Mar. 19, 2003 now abandoned entitled "White Light-Emitting OLED Device Having a Blue Light-Emitting Layer Doped With an Electron-Transporting or a Hole-Transporting Material or Both" by Tukaram K. Hatwar et al.

Reference is made to commonly assigned U.S. patent application Ser. No. 09/651,624 filed Aug. 30, 2000, now U.S. Pat. No. 6,699,177 issued Feb. 24, 2004, by Tukaram K. Hatwar, entitled "White Organic Electroluminescent Devices with Improved Stability and Efficiency"; Ser. No. 10/191,251 filed Jul. 8, 2002, now U.S. Pat. No. 6,720,092 issued Apr. 13, 2004, by Tukaram K. Hatwar, entitled "White Organic Light-Emitting Devices Using Rubrene Layer"; Ser. No. 10/183,242 filed Jun. 27, 2002, now U.S. Pat. No. 6,661,013 issued Dec. 19, 2003, by Benjamin P. Hoag et al., entitled "Organic Element for Electroluminescent Devices"; Ser. No. 10/086,067 filed Feb. 28, 2002, now U.S. Pat. No. 6,824,893 issued Feb. 28, 2002, by Benjamin P. Hoag et al., entitled "Organic Element for Electroluminescent Devices"; and Ser. No. 10/184,356 filed Jun. 27, 2002 (now abandoned) by Lelia Cosimbescu, entitled "Device Containing Green Organic Light-Emitting Diode", the disclosures of which are incorporated herein.

FIELD OF THE INVENTION

The present invention relates to organic light-emitting OLED devices, which produce white light with an enhanced blue light component.

BACKGROUND OF THE INVENTION

An OLED device includes a substrate, an anode, a hole-transporting layer made of an organic compound, an organic luminescent layer with suitable dopants, an organic electron-transporting layer, and a cathode. OLED devices are attractive because of their low driving voltage, high luminance, wide-angle viewing and capability for full-color flat emission displays. Tang et al. described this multilayer OLED device in U.S. Pat. Nos. 4,769,292 and 4,885,211.

Efficient white light producing OLED devices are considered a low cost alternative for several applications such as paper-thin light sources, backlights in LCD displays, automotive dome lights, and office lighting. White light producing OLED devices should be bright, efficient, and generally have Commission International d'Eclairage (CIE) chromaticity coordinates of about (0.33, 0.33). In any event, in accordance with this disclosure, white light is that light which is perceived by a user as having a white color.

The following patents and publications disclose the preparation of organic OLED devices capable of emitting white light, comprising a hole-transporting layer and an organic luminescent layer, and interposed between a pair of electrodes.

White light producing OLED devices have been reported by J. Shi (U.S. Pat. No. 5,683,823) wherein the luminescent layer includes red and blue light-emitting materials uniformly dispersed in a host emitting material. This device has good electroluminescent characteristics, but the concentration of the red and blue dopants are very small, such as 0.12% and 0.25% of the host material. These concentrations are difficult to control during large-scale manufacturing. Sato et al. in JP 7,142,169 disclose an OLED device, capable of emitting white light, made by placing a blue light-emitting layer next to the hole-transporting layer and followed by a green light-emitting layer having a region containing a red fluorescent layer. Kido et al., in Science, Vol. 267, p. 1332 (1995) and in APL Vol. 64, p. 815 (1994), report a white light producing OLED device. In this device three emitter layers with different carrier transport properties, each emitting blue, green or red light, are used to generate white light. Littman et al. in U.S. Pat. No. 5,405,709 disclose another white emitting device, which is capable of emitting white light in response to hole-electron recombination, and comprises a fluorescent in a visible light range from bluish green to red. Recently, Deshpande et al., in Applied Physics Letters, Vol. 75, p. 888 (1999), published a white OLED device using red, blue, and green luminescent layers separated by a hole blocking layer.

However, these OLED devices require very small amounts of dopant concentrations, making the process difficult to control for large-scale manufacturing. Also, emission color varies due to small changes in the dopant concentration. Full-color devices are made by combining white OLEDs with color filters. However, the color filter transmits only about 30% of the original light. Thus, when the white light is passed through the blue color filter, the blue component is very low in luminance intensity. Due to its low intensity, the blue channel of the R, G, B full-color display is required to operate at much higher current density. This reduces the lifetime of the blue color.

SUMMARY OF THE INVENTION

It is therefore an object of the present invention to produce an effective white light-emitting organic device with improved efficiency and operational stability of blue light emission.

This object is achieved by an organic light-emitting diode (OLED) device which produces substantially white light, comprising:

a) an anode;

b) a hole-transporting layer disposed over the anode;

c) a blue light-emitting layer having a host doped with a blue light-emitting compound disposed directly on the hole-transporting layer and the blue light-emitting layer being doped with an electron-transporting or a hole-transporting material or both selected to improve efficiency and operational stability;

d) an electron-transporting layer disposed over the blue light-emitting layer;

e) a cathode disposed over the electron-transporting layer; and f) the hole-transporting layer or electron-transporting layer, or both the hole-transporting layer and electron-transporting layer, being selectively doped with a compound which emits light in the yellow region of the spectrum which corresponds to an entire layer or a partial portion of a layer in contact with the blue light-emitting layer.

ADVANTAGES

The following are features and advantages of the present invention.

White light OLED devices, in accordance with the present invention, have significantly improved device efficiency and operational stability. More particularly, by adding a hole-transporting or electron-transporting material as co-dopants in a small amount along with the blue emitting dopant to the blue light-emitting layer, significant improvements can be achieved.

High efficiency white OLEDs can be used to fabricate full-color devices using the substrate with the on chip color filters (OCCF) and integrated thin film transistors.

OLED devices made in accordance with the present invention eliminate the need for using a shadow mask for making light-emitting layers in full-color OLED devices.

OLED devices made in accordance with the present invention can be produced with high reproducibility and consistency to provide high light efficiency.

These devices have high operational stability and also require low drive voltage.

DETAILED DESCRIPTION OF THE INVENTION

Figure 1:
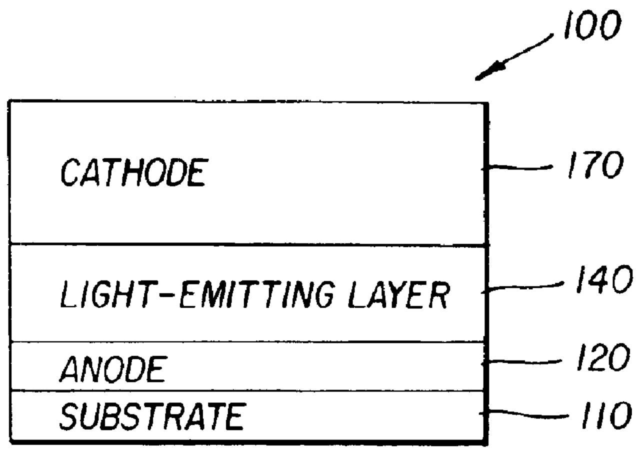
FIG. 1 depicts a prior art organic light-emitting device.

A conventional light-emitting layer of the organic OLED device comprises a luminescent or fluorescent material where electroluminescence is produced as a result of electron-hole pair recombination in this region. In the simplest construction, the device 100 as shown in FIG. 1 has a substrate 110 and a light-emitting layer 140 sandwiched between anode 120 and cathode 170. The light-emitting layer 140 is a pure material with a high luminescent efficiency. A well known material is tris(8-quinolinato) aluminum (Alq) which produces excellent green electroluminescence.

Figure 2:
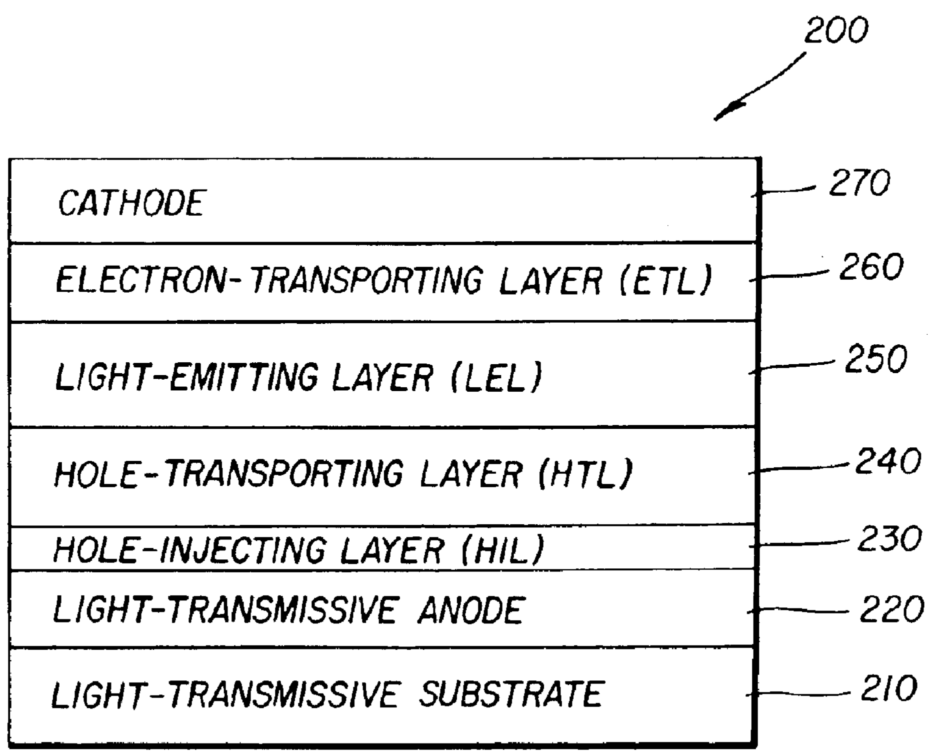
FIG. 2 depicts another prior art organic light-emitting device.

The simple structure can be modified to a three-layer structure (device 200) as shown in FIG. 2, in which an additional electroluminescent layer is introduced between the hole- and electron-transporting layers to function primarily as the site for hole-electron recombination and thus electroluminescence. In this respect, the functions of the individual organic layers are distinct and can therefore be optimized independently. Thus, the electroluminescent or recombination layer can be chosen to have a desirable OLED color as well as high luminance efficiency. Likewise, the electron and hole-transporting layers can be optimized primarily for the carrier transport property. It will be understood to those skilled in the art that the electron-transporting layer and the cathode can be made to be transparent, facilitating illumination of the device through its top layer and not through the substrate.

Turning to FIG. 2, an organic light-emitting device 200 has a light-transmissive substrate 210 on which is disposed a light-transmissive anode 220. An organic light-emitting structure is formed between the anode 220 and a cathode 270. The organic light-emitting structure is comprised of, in sequence, an organic hole-transporting layer 240 (HTL), an organic light-emitting layer 250, and an organic electron-transporting layer (ETL) 260. Layer 230 is a hole-injecting layer (HIL). When an electrical potential difference (not shown) is applied between the anode 220 and the cathode 270, the cathode will inject electrons into the electron-transporting layer 260 and the electrons will migrate across layer 260 to the light-emitting layer 250. At the same time, holes will be injected from the anode 220 into the hole-transporting layer 240. The holes will migrate across layer 240 and recombine with electrons at or near a junction formed between the hole-transporting layer 240 and the light-emitting layer 250. When a migrating electron drops from its conduction band to a valance band in filling a hole, energy is released as light, and which is emitted through the light-transmissive anode 220 and substrate 210.

The organic OLED devices can be viewed as a diode, which is forward biased when the anode is at a higher potential than the cathode. The anode and cathode of the organic OLED device can each take any convenient conventional form, such as any of the various forms disclosed by Tang et al. in U.S. Pat. No. 4,885,211. Operating voltage can be substantially reduced when using a low-work function cathode and a high-work function anode. The preferred cathodes are those constructed of a combination of a metal having a work function less than 4.0 eV and one other metal, preferably a metal having a work function greater than 4.0 eV. The Mg:Ag of Tang et al. U.S. Pat. No. 4,885,211 constitutes one preferred cathode construction. The Al:Mg cathodes of Van Slyke et al. U.S. Pat. No. 5,059,062 is another preferred cathode construction. Hung et al. in U.S. Pat. No. 5,776,622 has disclosed the use of a LiF/Al bilayer to enhanced electron injection in organic OLED devices. Cathodes made of either Mg:Ag, Al:Mg or LiF/Al are opaque and displays cannot be viewed through the cathode. Recently, a series of publications by Gu et al. in APL 68, 2606 (1996); Burrows et al., J. Appl. Phys. 87, 3080 (2000); Parthasarathy et al. APL 72, 2138 9198); Parthasarathy et al.

APL 76, 2128 (2000); and Hung et al. APL, 3209 (1999) have disclosed transparent cathodes. These transparent cathodes are based on the combination of a thin semitransparent metal (~10 nm) and indium-tin-oxide (ITO) on top of the metal. An organic layer of copper phthalocyanine (CuPc) also replaced thin metal.

Conventionally, anode 220 is formed of a conductive and transparent oxide. Indium tin oxide has been widely used as the anode contact because of its transparency, good conductivity, and high-work function.

In a preferred embodiment, an anode 220 can be modified with a hole-injecting layer 230. The hole-injecting material can serve to improve the film formation property of subsequent organic layers and to facilitate injection of holes into the hole-transporting layer. Suitable materials for use in the hole-injecting layer include, but are not limited to, porphyrinic compounds such as CuPC as described in U.S. Pat. No. 4,720,432, and plasma-deposited fluorocarbon polymers as described in U.S. Pat. No. 6,208,075. and some aromatic amines, for example, m-MTDATA (4,4',4"-tris[(3-methylphenyl)phenylamino]triphenylamine). Alternative hole-injecting materials reportedly useful in organic EL devices are described in EP 0 891 121 A1 and EP 1 029 909 A1. An example of material in such a hole-injecting layer are the fluorocarbons disclosed by Hung et al. in U.S. Pat. No. 6,208,075.

The OLED device of this invention is typically provided over a supporting substrate 210 where either the cathode or anode can be in contact with the substrate. The electrode in contact with the substrate is conveniently referred to as the bottom electrode. Conventionally, the bottom electrode is the anode, but this invention is not limited to that configuration. The substrate can either be light-transmissive or opaque, depending on the intended direction of light emission. The light-transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light-transmissive, light absorbing or light reflective. Substrates for use in this case include, but are not limited to, glass, plastic, semiconductor materials, silicon, ceramics, circuit board materials, and polished metal surface. Of course, it is necessary to provide in these device configurations a light-transparent top electrode.

The white OLED emission can be used to prepare a full-color device using red, green, and blue (R, G, B) color filters. The R, G, B filters may be deposited on the substrate (when light transmission is through the substrate), incorporated into the substrate, or deposited over the top electrode (when light transmission is through the top electrode). When depositing a R, G, B filter array over the top electrode, a buffer layer may be used to protect the top electrode. The buffer layer may comprise inorganic materials, for example, silicon oxides and nitrides, or organic materials, for example, polymers, or multiple layers of inorganic and organic materials. Methods for providing R, G, B filter arrays are well known in the art. Lithographic means, inkjet printing, and laser thermal transfer are just a few of the methods by which R, G, B filters may be provided.

This technique of producing a full-color display using white light plus R, G, B filters has several advantages over the precision shadow masking technology used for producing full-color displays. This technique does not require precision alignment, is low cost and easy to manufacture. The substrate itself contains thin film transistors to address the individual pixels. U.S. Pat. Nos. 5,550,066 and 5,684,365 to Ching et al. describe the addressing methods of the TFT substrates.

The hole-transporting layer contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al. U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The hole-transporting layer can be formed of a single or a mixture of aromatic tertiary amine compounds set forth in Table 1. Illustrative of useful aromatic tertiary amines is the following list. In accordance with the present invention, these materials can also be used as dopants in the blue light-emitting layer and, for the purpose of this disclosure, will be called blue stabilizing hole-transporting materials.

TABLE 1

| |
|---|
| 1,1-Bis(4-di-p-tolylaminophenyl)cyclohexane |
| 1,1-Bis(4-di-p-tolylaminophenyl)-4-phenylcyclohexane |
| 4,4'-Bis(diphenylamino)quadriphenyl |
| Bis(4-dimethylamino-2-methylphenyl)-phenylmethane |
| N,N,N-Tri(p-tolyl)amine |
| 4-(di-p-tolylamino)-4'-[4(di-p-tolylamino)-styryl]stilbene |
| N,N,N',N'-Tetra-p-tolyl-4-4'-diaminobiphenyl |
| N,N,N',N'-Tetraphenyl-4,4'-diaminobiphenyl |
| N,N,N',N'-tetra-1-naphthyl-4,4'-diaminobiphenyl |
| N,N,N',N'-tetra-2-naphthyl-4,4'-diaminobiphenyl |
| N-Phenylcarbazole |
| 4,4'-Bis[N-(1-naphthyl)-N-phenylamino]biphenyl (NPB) |
| 4,4'-Bis[N-(1-naphthyl)-N-(2-naphthyl)amino]biphenyl (TNB) |
| 4,4"-Bis[N-(1-naphthyl)-N-phenylamino]p-terphenyl |
| 4,4'-Bis[N-(2-naphthyl)-N-phenylamino]biphenyl |
| 4,4'-Bis[N-(3-acenaphthenyl)-N-phenylamino]biphenyl |
| 1,5-Bis[N-(1-naphthyl)-N-phenylamino]naphthalene |
| 4,4'-Bis[N-(9-anthryl)-N-phenylamino]biphenyl |
| 4,4"-Bis[N-(1-anthryl)-N-phenylamino]-p-terphenyl |
| 4,4'-Bis[N-(2-phenanthryl)-N-phenylamino]biphenyl |
| 4,4'-Bis[N-(8-fluoranthenyl)-N-phenylamino]biphenyl |
| 4,4'-Bis[N-(2-pyrenyl)-N-phenylamino]biphenyl |
| 4,4'-Bis[N-(2-naphthacenyl)-N-phenylamino]biphenyl |
| 4,4'-Bis[N-(2-perylenyl)-N-phenylamino]biphenyl |
| 4,4'-Bis[N-(1-coronenyl)-N-phenylamino]biphenyl |
| 2,6-Bis(di-p-tolylamino)naphthalene |
| 2,6-Bis[di-(1-naphthyl)amino]naphthalene |
| 2,6-Bis[N-(1-naphthyl)-N-(2-naphthyl)amino]naphthalene |
| N,N,N',N'-Tetra(2-naphthyl)-4,4"-diamino-p-terphenyl |
| 4,4'-Bis{N-phenyl-N-[4-(1-naphthyl)-phenyl]amino}biphenyl |
| 4,4'-Bis[N-phenyl-N-(2-pyrenyl)amino]biphenyl |
| 2,6-Bis[N,N-di(2-naphthyl)amine]fluorene |
| 1,5-Bis[N-(1-naphthyl)-N-phenylamino]naphthalene |
| 4,4',4"-tris[(3-methylphenyl)phenylamino]triphenylamine (MTDATA) |
| 4,4'-Bis[N-(3-methylphenyl)-N-phenylamino]biphenyl (TPD) |

Another class of useful hole-transporting materials includes polycyclic aromatic compounds as described in EP 1 009 041. Tertiary aromatic amines with more than two amine groups may be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Preferred materials for use in forming the electron-transporting layer of the organic OLED devices of this invention are metal chelated oxinoid compounds, including chelates of oxine itself (also commonly referred to as 8-quinolinol or 8-hydroxyquinoline) as disclosed in U.S. Pat. No. 4,885,211. Tris(8-quinolinolato)aluminum(III) also commonly known as Alq is one of the commonly used electron-transporting materials. Such compounds exhibit high levels of performance and are readily fabricated in the form of thin layers. Some examples of useful electron-transporting materials are:

Aluminum trisoxine [alias, tris(8-quinolinolato)aluminum (III)]
Magnesium bisoxine [alias, bis(8-quinolinolato)magnesium (II)]
Bis[benzo{f}-8-quinolinolato]zinc (II)
Bis(2-methyl-8-quinolinolato)aluminum(III)-$\mu$-oxo-bis(2-methyl-8-quinolinolato)aluminum(III)
Indium trisoxine [alias, tris(8-quinolinolato)indium]
Aluminum tris(5-methyloxine) [alias, tris(5-methyl-8-quinolinolato) aluminum(III)]
Lithium oxine [alias, (8-quinolinolato)lithium(I)]
Gallium oxine [alias, tris(8-quinolinolato)gallium(III)]
Zirconium oxine [alias, tetra(8-quinolinolato)zirconium (IV)]

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

Another material of the series, BAlq, has been used as an electron-transporting material. U.S. Pat. No. 5,141,671 issued to Bryan et al. discusses such materials. The BAlq is comprised of a mixed ligand aluminum chelate, specifically a bis(Rs-8-quinolinolato)(phenolato)aluminum(II) chelate, where Rs is a ring substituent of the 8-quinolinolato ring nucleus. These compounds are represented by the formula Rs-Q2-Al—O-L where Q in each occurrence represents a substituted 8-quinolinolato ligand, Rs represents an 8-quinolinolato ring substituent to block sterically the attachment of more than two substituted 8-quinolinolato ligand to the aluminum atom, O-L is phenolatoligand, and L is a hydrocarbon of from 6 to 24 carbon atoms comprised of phenyl moiety. One such compound, particularly ((1,1'-biphenyl)-4-olato)bis(2-methyl-8-quinolinoato N1,O8) aluminum, has been used as a hole blocking material by T. Watanabe et al., Proceedings of SPIE Vol. 4105 (2001), p. 175–182.

A preferred embodiment of the luminescent layer consists of a host material doped with fluorescent dyes. Using this method, highly efficient EL devices can be constructed. Simultaneously, the color of the EL devices can be tuned by using fluorescent dyes of different emission wavelengths in a common host material. Tang et al. in commonly assigned U.S. Pat. No. 4,769,292 has described this dopant scheme in considerable detail for EL devices using Alq as the host material.

Shi et al. in commonly assigned U.S. Pat. No. 5,935,721 have described this dopant scheme in considerable detail for the blue emitting OLED devices using 9,10-di-(2-naphthyl) anthracene (ADN) derivatives as the host material.

Derivatives of 9,10-di-(2-naphthyl)anthracene (Formula 1) constitute one class of useful hosts capable of supporting electroluminescence, and are particularly suitable for light emission of wavelengths longer than 400 nm, e.g., bluegreen, yellow, orange, or red. , Formula 1

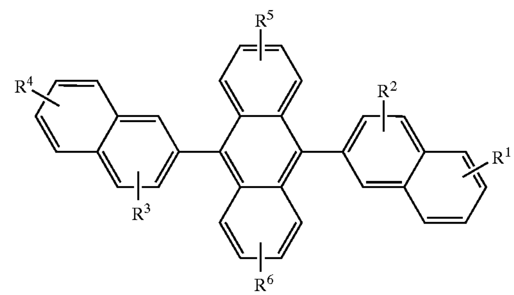

wherein $R_1$, $R_2$, $R_3$, $R_4$, $R_5$, $R_6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of naphthyl, anthracenyl; phenanthryl, pyrenyl, or perylenyl;

Group 4: heteroaryl or substituted heteroaryl of from 5 to 24 carbon atoms such as thiazolyl, furyl, thienyl, pyridyl, quinolinyl or other heterocyclic systems, which may be bonded via a single bond, or may complete a fused heteroaromatic ring system;

Group 5: alkoxylamino, alkylamino, or arylamino of from 1 to 24 carbon atoms; or Group 6: fluorine, chlorine, bromine or cyano.

Illustrative examples include 9,10-di-(2-naphthyl) anthracene (ADN) and 2-t-butyl-9,10-di-(2-naphthyl) anthracene (TBADN). Other anthracene derivatives can be useful as a host in the LEL, such as diphenylanthracene and its derivatives, as described in U.S. Pat. No. 5,927,247. Styrylarylene derivatives as described in U.S. Pat. No. 5,121,029 and JP 08333569 are also useful hosts for blue emission. For example, 9,10-bis[4-(2,2-diphenylethenyl) phenyl]anthracene and 4,4'-Bis(2,2-diphenylethenyl)-1,1'-biphenyl (DPVBi) are useful hosts for blue emission.

Many blue fluorescent dopants are known in the art, and are contemplated for use in the practice of this invention. Particularly useful classes of blue-emitting dopants include perylene and its derivatives such as 2,5,8,11-tetra-tert-butyl perylene (TBP), and distyrylamine derivatives as described in U.S. Pat. No. 5,121,029, such as B1 (structure shown below)

B-1

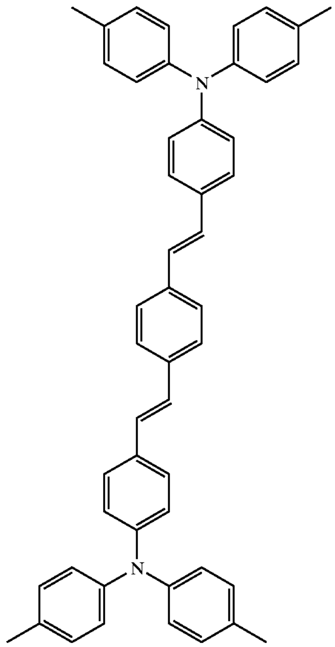

Another useful class of blue-emitting dopants is represented by Formula 2 and is described in commonly assigned U.S. Pat. No. 6,661,023, the disclosure of which is incorporated herein.

Formula 2

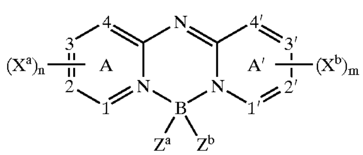

wherein:

A and A' represent independent azine ring systems corresponding to 6-membered aromatic ring systems containing at least one nitrogen;

each $X^a$ and $X^b$ is an independently selected substituent, two of which may join to form a fused ring to A or A';

m and n are independently 0 to 4;

$Z^a$ and $Z^b$ are independently selected substituents; and 1, 2, 3, 4, 1', 2', 3', and 4' are independently selected as either carbon or nitrogen atoms.

Desirably, the azine rings are either quinolinyl or isoquinolinyl rings such that 1, 2, 3, 4, 1', 2', 3', and 4' are all carbon; m and n are equal to or greater than 2; and $X^a$ and $X^b$ represent at least two carbon substituents which join to form an aromatic ring. Desirably, $Z^a$ and $Z^b$ are fluorine atoms.

Preferred embodiments further include devices where the two fused ring systems are quinoline or isoquinoline systems; the aryl or heteroaryl substituent is a phenyl group; there are present at least two $X^a$ groups and two $X^b$ groups which join to form a 6—6 fused ring, the fused ring systems are fused at the 1–2, 3–4, 1'–2', or 3'–4' positions, respectively; one or both of the fused rings is substituted by a phenyl group; and where the dopant is depicted in Formula 3, 4, or 5.

Formula 3

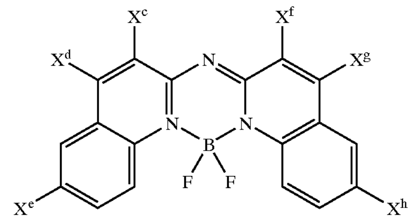

Formula 4

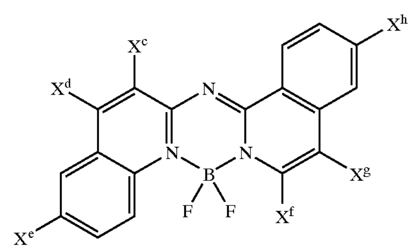

Formula 5

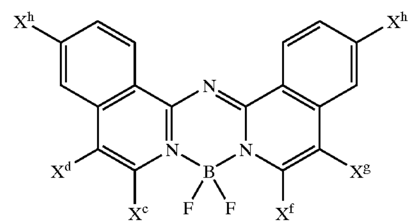

wherein each $X^c$, $X^d$, $X^e$, $X^f$, $X^g$, and $X^h$ is hydrogen or an independently selected substituent, one of which must be an aryl or heteroaryl group.

Desirably, the azine rings are either quinolinyl or isoquinolinyl rings such that 1, 2, 3, 4, 1', 2', 3', and 4' are all carbon; m and n are equal to or greater than 2; and $X^a$ and $X^b$ represent at least two carbon substituents which join to form an aromatic ring, and one is an aryl or substituted aryl group. Desirably, $Z^a$ and $Z^b$ are fluorine atoms.

Illustrative, non-limiting examples of boron compounds complexed by two ring nitrogens of a deprotonated bis(azinyl)amine ligand, wherein the two ring nitrogens are members of different 6,6 fused ring systems in which at least one of the systems contains an aryl or heteroaryl substituent, useful in the present invention are the following:

B-2

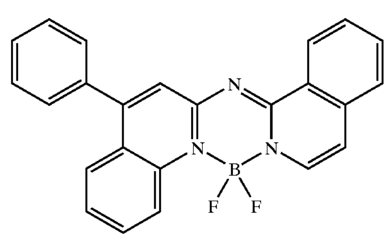

-continued

B-3

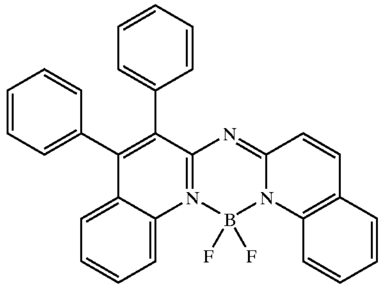

;

B-4

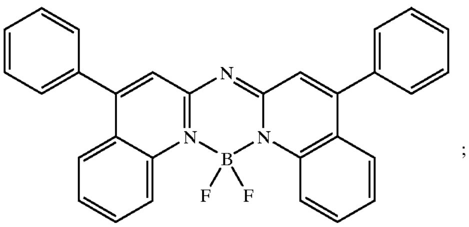

;

B-5

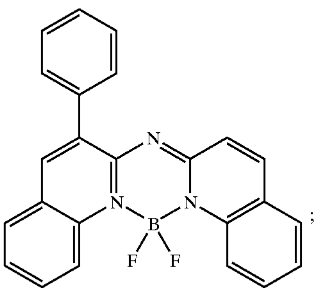

;

B-6

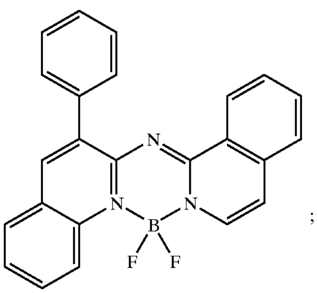

;

B-7

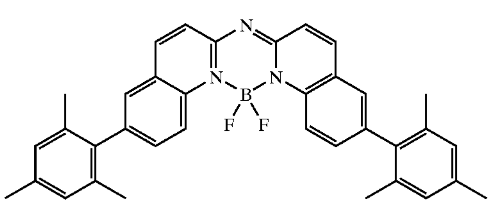

; and

B-8

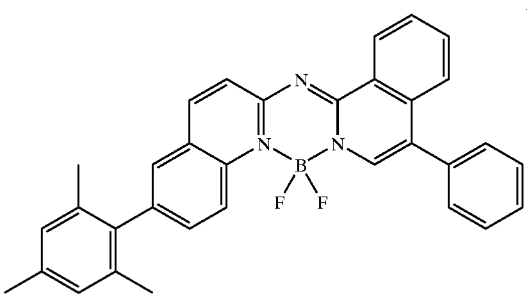

Preferred materials for uses as a yellow-emitting dopant in the hole-transporting or electron-transporting layers are those represented by Formula 6.

Formula 6

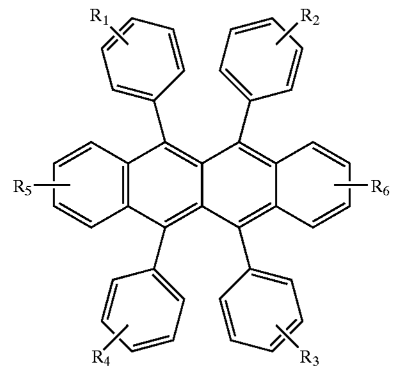

wherein $R_1$, $R_2$, $R_3$, and $R_4$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of phenyl, naphthyl, anthracenyl; phenanthryl, pyrenyl, or perylenyl;

Group 4: heteroaryl or substituted heteroaryl of from 5 to 24 carbon atoms such as thiazolyl, furyl, thienyl, pyridyl, quinolinyl or other heterocyclic systems, which may be bonded via a single bond, or may complete a fused heteroaromatic ring system;

Group 5: alkoxylamino, alkylamino, or arylamino of from 1 to 24 carbon atoms; or Group 6: fluorine, chlorine, bromine or cyano.

$R_5$ and $R_6$ are defined in the same way as $R_1$–$R_4$ except that they do not form a fused ring.

Further, at least one of $R_1$–$R_4$ must be substituted with a group. Preferred groups for substitution on $R_1$–$R_4$ are Groups 3 and 4.

Examples of particularly useful yellow dopants include 5,6,11,12-tetraphenylnaphthacene (rubrene); 6,11-diphenyl-5,12-bis(4-(6-methyl-benzothiazol-2-yl)phenyl) naphthacene (DBzR); and 5,6,11,12-tetra(2-naphthyl) naphthacene (NR), the formulas of which are shown below:

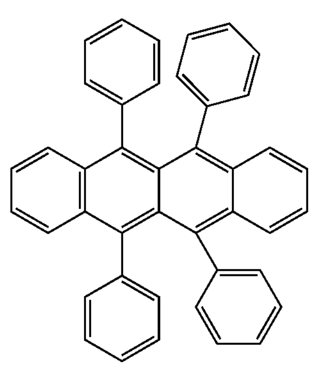

;

(rubrene)

-continued

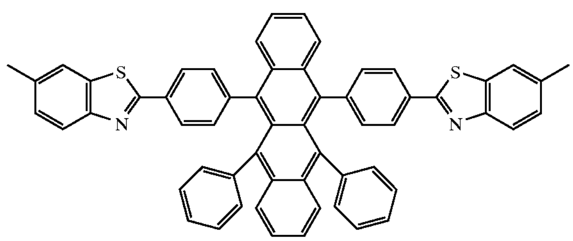

;

(DBzR)

and

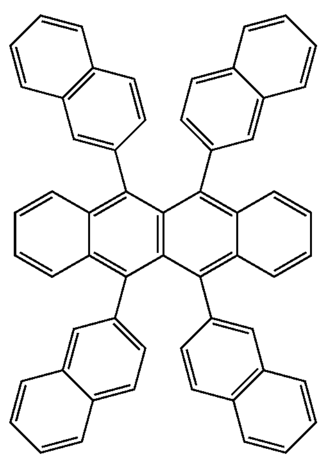

.

(NR)

Coumarins represent a useful class of green-emitting dopants as described by Tang et al. in U.S. Pat. Nos. 4,769,292 and 6,020,078. Examples of useful green-emitting coumarins include C545T and C545TB. Quinacridones represent another useful class of green-emitting dopants. Useful quinacridones are described in U.S. Pat. No. 5,593,788, and Publication JP 09-13026A, the disclosure of which is incorporated herein.

Examples of particularly useful green-emitting quinacridones are shown below:

G-1

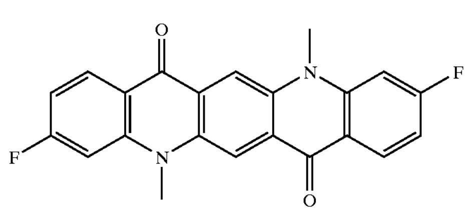

; and

-continued

G-2

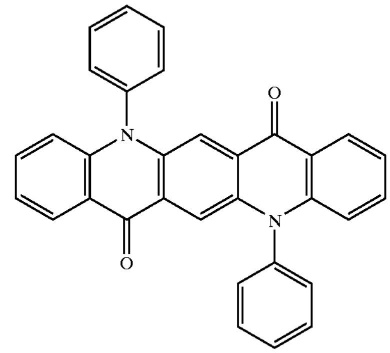

.

Another useful class of green-emitting dopants is represented by Formula 7 below.

Compounds useful in the invention are suitably represented by Formula 7:

Formula 7

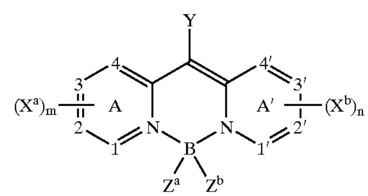

wherein:

A and A' represent independent azine ring systems corresponding to 6-membered aromatic ring systems containing at least one nitrogen;

each $X^a$ and $X^b$ is an independently selected substituent, two of which may join to form a fused ring to A or A';

m and n are independently 0 to 4;

Y is H or a substituent;

$Z^a$ and $Z^b$ are independently selected substituents; and 1, 2, 3, 4, 1', 2', 3', and 4' are independently selected as either carbon or nitrogen atoms.

In the device, 1, 2, 3, 4, 1', 2', 3', and 4' are conveniently all carbon atoms. The device may desirably contain at least one or both of ring A or A' that contains substituents joined to form a fused ring. In one useful embodiment, there is present at least one $X^a$ or $X^b$ group selected from the group consisting of halide and alkyl, aryl, alkoxy, and aryloxy groups. In another embodiment, there is present a $Z^a$ and $Z^b$ group independently selected from the group consisting of fluorine and alkyl, aryl, alkoxy and aryloxy groups. A desirable embodiment is where $Z^a$ and $Z^b$ are F. Y is suitably hydrogen or a substituent such as an alkyl, aryl, or heterocyclic group.

The emission wavelength of these compounds may be adjusted to some extent by appropriate substitution around the central bis(azinyl)methene boron group to meet a color aim, namely green. Some examples of useful formulas follow:

G-3

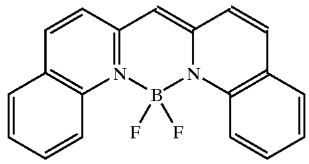

;

G-4

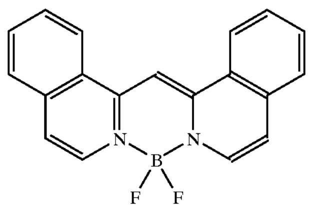

;

G-5

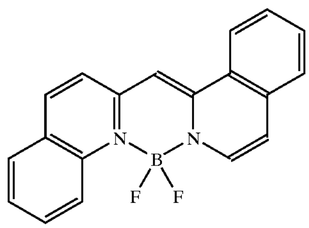

;

G-6

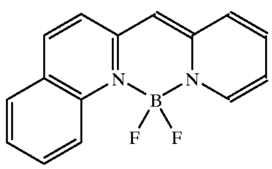

; and

G-7

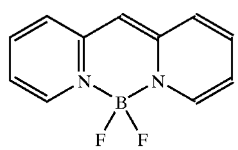

.

The invention and its advantages are further illustrated by the specific examples that follow. The term "percentage" indicates the volume percentage (or a thickness ratio as measured on the thin film thickness monitor) of a particular dopant with respect to the host material.

FIGS. 3–14 show schematics of the white light producing OLED device structure that have been made in accordance with the present invention and graphs of various parameters of their operations. The invention and its advantages are further illustrated by the specific examples that follow.

Figure 3:
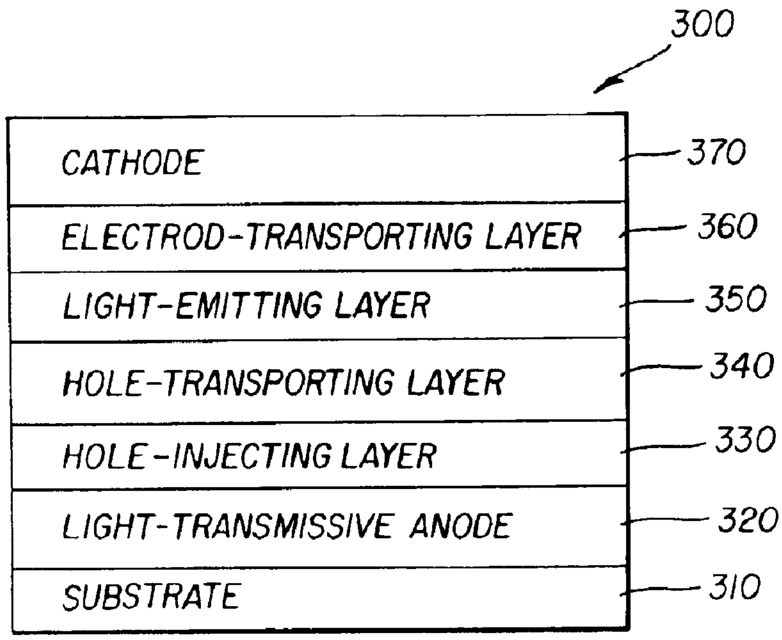
FIG. 3 depicts a white light producing OLED device wherein the hole-transporting layer is doped with the super rubrene yellow dopant.

Turning to FIG. 3, an organic white light-emitting device 300 has a light-transmissive substrate 310 on which is disposed a light-transmissive anode 320. An organic white light-emitting structure 300 is formed between the anode 320 and a cathode 370. The organic light-emitting structure is comprised of, in sequence, a hole-injecting layer 330, and an organic hole-transporting layer 340, which is doped with yellow-emitting dopants. An organic light-emitting layer 350 is a blue light-emitting layer comprising TBADN host, B-1 dopant, and co-dopants selected from a group of NPB, Alq, and BAlq. An organic electron-transporting layer 360 is made of Alq.

Figure 4:
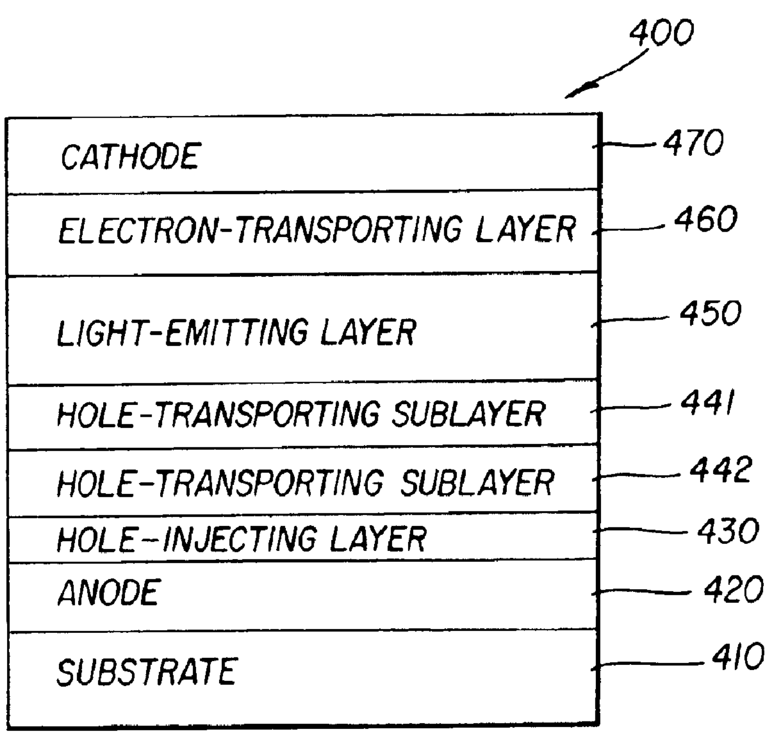
FIG. 4 depicts another structure of white light producing OLED device wherein hole-transporting layer is doped with super rubrene yellow dopant and has two sublayers.

FIG. 4 depicts an organic white light-emitting device 400 which is similar to that shown in FIG. 3, except that the organic hole-transporting layer comprises two sublayers, layers 441 and layer 442. Layer 442 is made of undoped NPB and the layer 441, which is adjacent to the blue light-emitting layer 450, is doped with yellow-emitting dopant. Other layers of the structure 400 are substrate 410, anode 420, hole-injecting layer 430, electron-transporting layer 460, and cathode 470.

Figure 5:
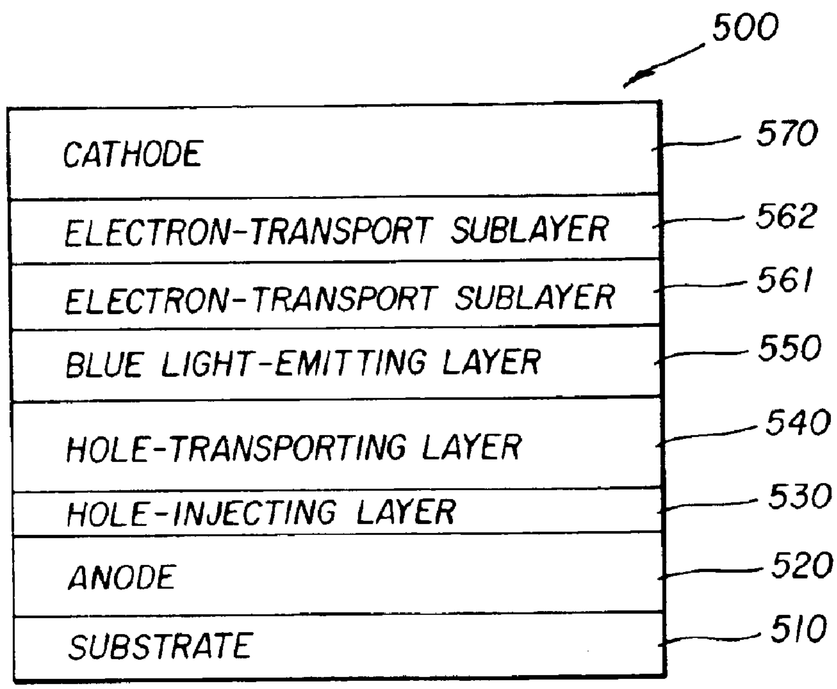
FIG. 5 depicts a white light producing OLED device wherein the electron-transporting layer is doped with yellow dopant.

FIG. 5 depicts an organic white light-emitting device 500. The electron-transporting layer comprises two sublayers, 561 and 562. Electron-transporting sublayer 561 is doped with the yellow-emitting dopant. Electron-transporting sublayer 562 is not doped with a light-emitting dopant. The blue light-emitting layer 550 comprises TBADN host, B-1 dopant, and co-dopants selected from a group of NPB, Alq, and BAlq. Other layers of the structure 500 are substrate 510, anode 520, hole-injecting layer 530, hole transport layer 540 and cathode 570.

Figure 6:
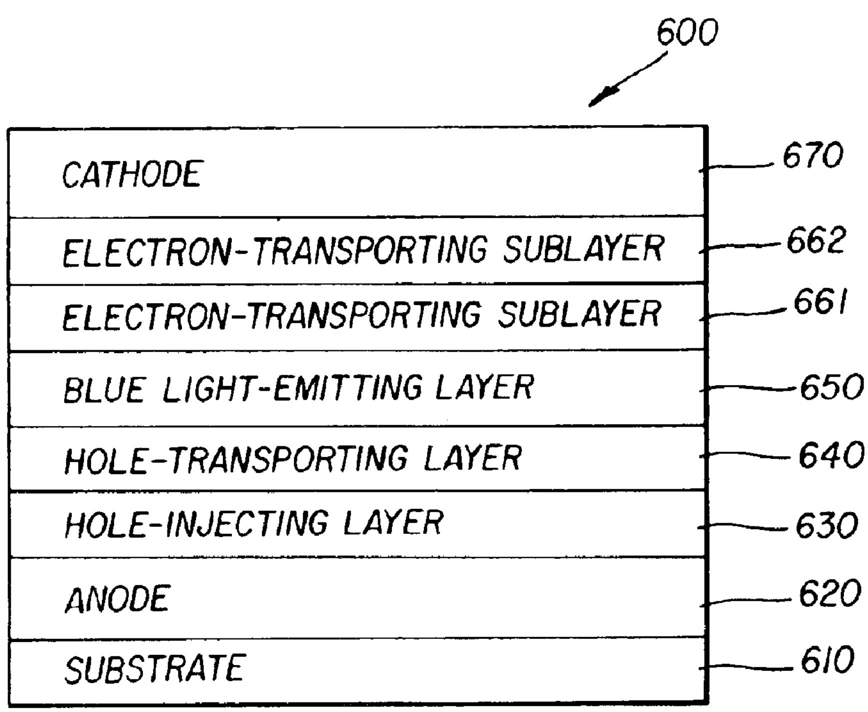
FIG. 6 depicts another structure of white light producing OLED device wherein both the hole-transporting layer and the electron-transporting layer are doped with yellow dopant.

FIG. 6 depicts an organic white light-emitting device 600, which is a combination of structure 300 and structure 500. The hole-transporting layer 640 is doped with a yellow-emitting dopant. The electron-transporting layer comprises two electron-transporting sublayers, 661 and 662, and sublayer 661 is doped with a yellow-emitting dopant. The blue light-emitting layer 650 is made of TBADN host, B-1 dopant, and co-dopants selected from a group of NPB, Alq, and BAlq. Other layers of structure 600 are substrate 610, anode 620, hole-injecting layer 630, electron-transporting layer 662, and cathode 670.

Figure 7:
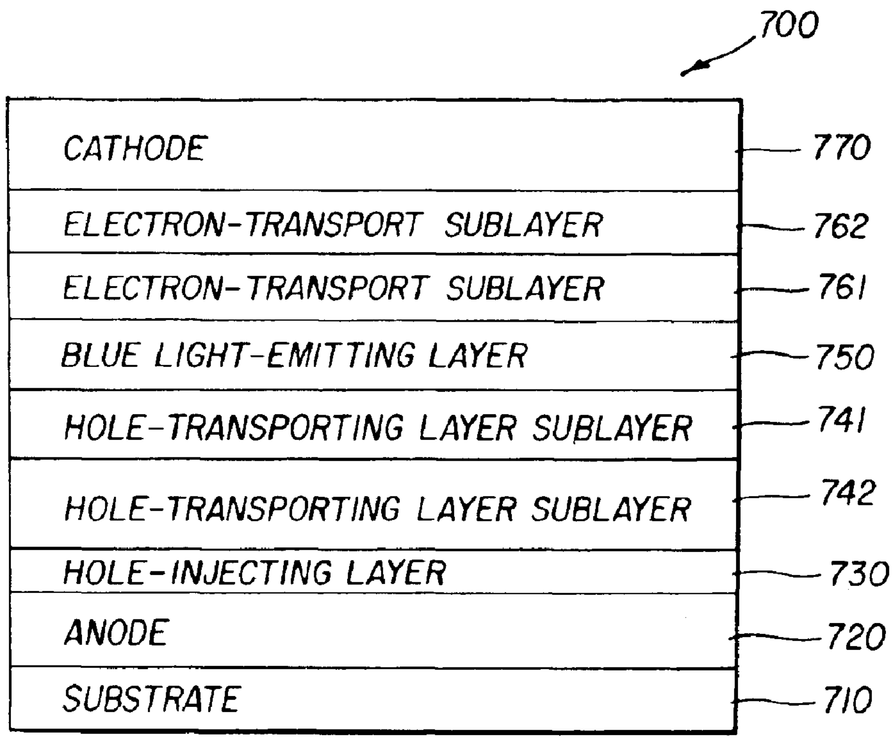
FIG. 7 depicts another structure of white light producing OLED device wherein both the hole-transporting layer and the electron-transporting layer are doped with yellow dopant and has two sublayers.

FIG. 7 depicts an organic white light-emitting device 700 which is similar to that shown in FIG. 6, except that the organic hole-transporting layer consists of two sublayers, sublayers 741 and 742. Sublayer 742 is made of undoped NPB, and sublayer 741, adjacent to the blue light-emitting layer 750, is doped with a yellow-emitting dopant. The electron-transporting layer comprises two sublayers, sublayers 761 and 762. Electron-transporting sublayer 761 is adjacent to the blue light-emitting layer 750, and is also doped with yellow-emitting dopant. Electron-transporting sublayer 762 is not doped with a light-emitting dopant. Other layers of structure 700 are substrate 710, anode 720, hole-injecting layer 730, and cathode 770.

Figure 8:
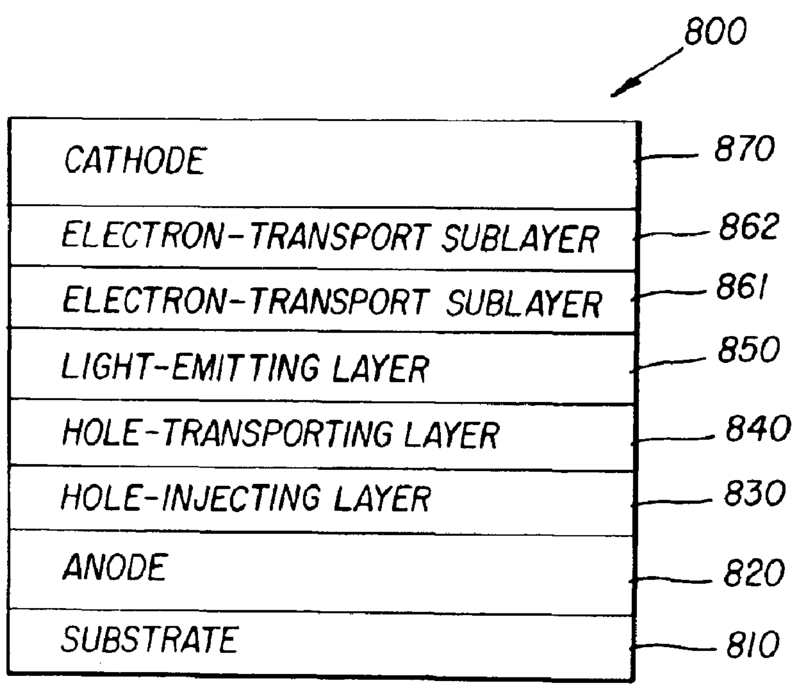
FIG. 8 depicts a white light producing OLED device wherein the hole-transporting layer is doped with the yellow dopant and has an additional green-emitting layer.

FIG. 8 depicts an organic white light-emitting device 800 that is similar to that shown in FIG. 3, except that the electron-transporting layer comprises two sublayers, 861 and 862. Electron-transporting sublayer 861 comprises a green-emitting dopant such as C545T, CFDMQA, and DPQA, and sublayer 861 is adjacent to the blue light-emitting layer 850. Electron-transporting sublayer 862 is not doped with a light-emitting dopant. The blue light-emitting layer is 850 and consists of TBADN host, B-1 dopant and co-dopants selected from a group of NPB, Alq, and BAlq. The hole-transporting layer 840 is doped with a yellow-emitting dopant. Other layers of the structure 800 are substrate 810, anode 820, hole-injecting layer 830, and cathode 870.

Figure 9:
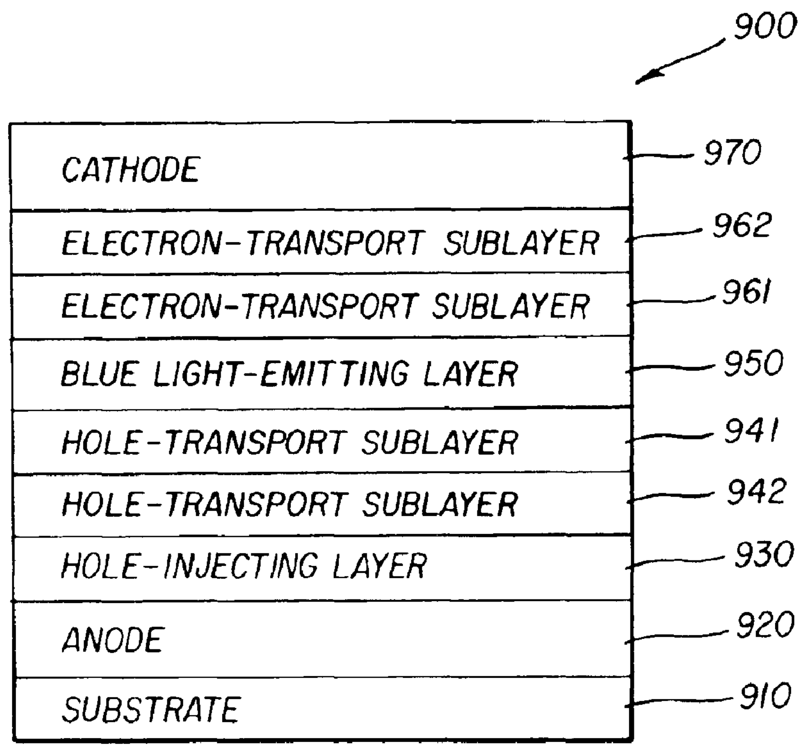
FIG. 9 depicts another structure of white light producing OLED device wherein the hole-transporting layer is doped with yellow dopant and has two sublayers and has an additional green-emitting layer.

FIG. 9 depicts an organic white light-emitting device 900 which is similar to that shown in FIG. 8, except that the organic hole-transporting layer comprises two sublayers, 941 and 942. Hole-transporting sublayer 942 is made of undoped NPB, and sublayer 941 adjacent to the blue light-emitting layer 950 is doped with a yellow-emitting dopant. The electron-transporting layer comprises two sublayers, 961 and 962. The electron-transporting sublayer 961 is adjacent to the blue light-emitting layer 950, and comprises Alq doped with green dopants such as C545T, CFDMQA, and DPQA. Electron-transporting sublayer 962 is not doped with a light-emitting dopant. The blue light-emitting layer i950 consists of TBADN host, B-1 dopant and co-dopants selected from a group of NPB, Alq, and BAlq. Other layers of the structure 900 are substrate 910, anode 920, hole-injecting layer 930, and cathode 970.

Figure 10:
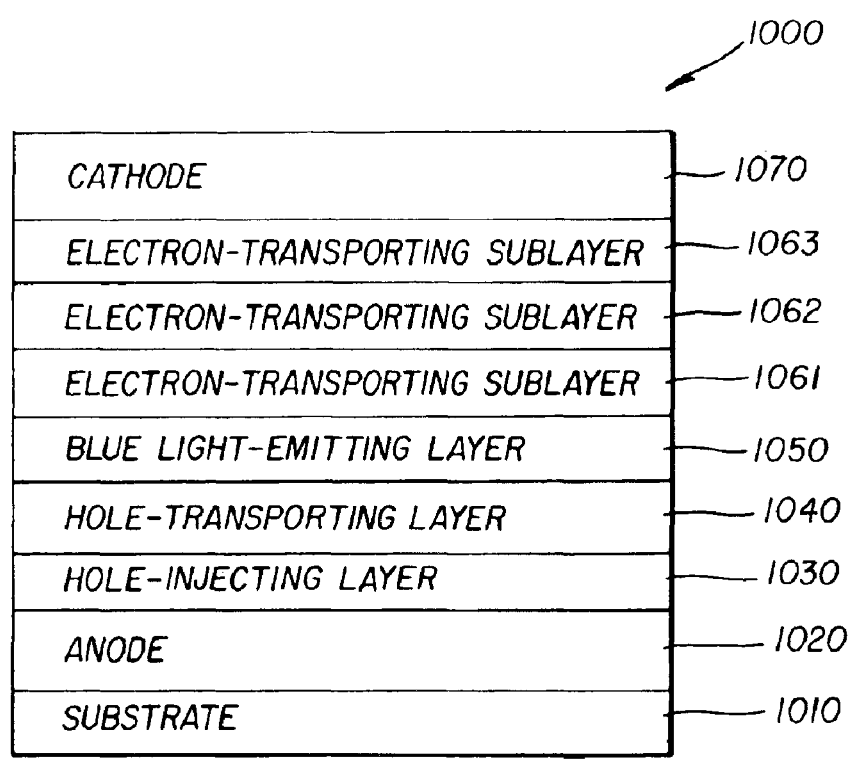
FIG. 10 depicts a white light producing OLED device wherein the electron-transporting layer is doped with yellow dopant and has an additional green-emitting layer.

FIG. 10 depicts an organic white light-emitting device 1000. Here, the electron-transporting layer comprises three sublayers 1061, 1062, and 1063. The electron-transporting sublayer 1061 is doped with a yellow-emitting dopant, and this layer is adjacent to the blue light-emitting layer 1050. Electron-transporting sublayer 1062 comprises a green-emitting dopant such as C545T, CFDMQA, or DPQA. Electron-transporting sublayer 1063 is not doped with a light-emitting dopant. The blue light-emitting layer 1050 can comprise TBADN host, B-1 dopant, and co-dopants selected from a group of NPB, Alq, and BAlq. Other layers of the structure 1000 are substrate 1010, anode 1020, hole-injecting layer 1030, hole-transporting layer 1040, and cathode 1070.

Figure 11:
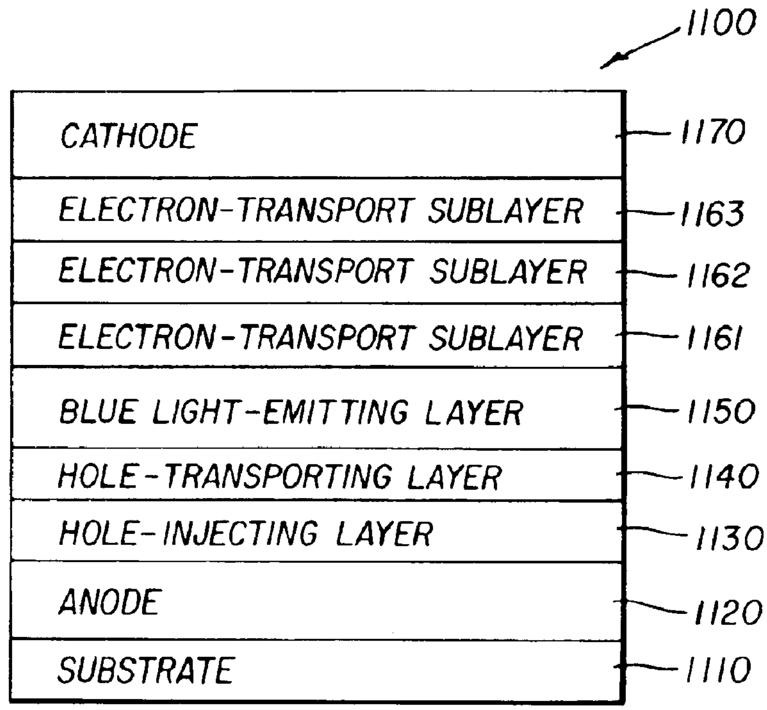
FIG. 11 depicts another structure of white light producing OLED device wherein both the hole-transporting layer and the electron-transporting layer are doped with yellow dopant and has an additional green-emitting layer.

FIG. 11 depicts an organic white light-emitting device 1100. Here, the electron-transporting layer comprises three sublayers 1161, 1162, and 1163. The electron-transporting sublayer 1161 is doped with a yellow-emitting dopant, and this layer is adjacent to the blue light-emitting layer 1150. Electron-transporting sublayer 1162 comprises a green-emitting dopant such as C545T, CFDMQA, or DPQA. Electron-transporting sublayer 1163 is not doped with a light-emitting dopant. The blue light-emitting layer 1150 can comprise TBADN host, B-1 dopant, and co-dopants selected from a group of NPB, Alq, and BAlq. The hole-transporting layer 1140 is doped with a super rubrene yellow dopant. This device shows very high stability, high luminance efficiency, and good spectral radiance for all colors after the R, G, B color filters. Other layers of the structure 1100 are substrate 1110, anode 1120, hole-injecting layer 1130, and cathode 1170.

Figure 12:
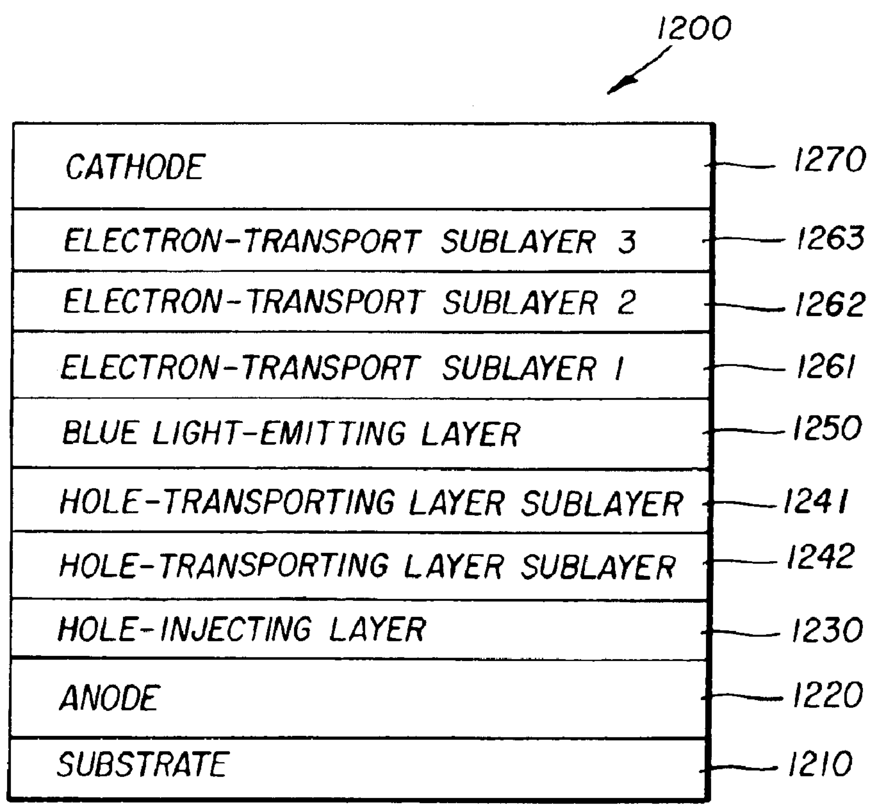
FIG. 12 depicts another structure of white light producing OLED device wherein both the hole-transporting layer and the electron-transporting layer are doped with yellow dopant and has two sublayers, and has an additional green-emitting layer.

FIG. 12 depicts an organic white light-emitting device 1200. Here, the electron-transporting layer comprises three sublayers 1261, 1262, and 1263. The electron-transporting sublayer 1261 is doped with the yellow-emitting dopant, and this layer is adjacent to the blue light-emitting layer 1250. Electron-transporting sublayer 1262 comprises a green-emitting dopant such as C545T, CFDMQA, or DPQA. Electron-transporting sublayer 1263 is not doped with a light-emitting dopant. The blue light-emitting layer 1250 can comprise TBADN host, B-1 dopant, and co-dopants selected from a group of NPB, Alq, and BAlq. The hole-transporting layer comprises two sublayers, 1241 and 1242. Hole-transporting sublayer 1241 is undoped NPB. Hole-transporting sublayer 1242 is adjacent to blue light-emitting layer 1250, and is doped with a yellow-emitting dopant. Other layers of the structure 1200 are substrate 1210, anode 1220, hole-injecting layer 1230, and cathode 1170.

The invention and its advantages are further illustrated by the specific following examples.

Device Examples 1 to 6 given in Table 2 indicate the improvement in the luminance and stability performance of the white devices when the blue emitting layer is doped with an electron-transporting material such as Alq.

An OLED device was constructed in the following manner.

Substrates coated with 80 nm ITO were sequentially ultrasonicated in a commercial detergent, rinsed in deionized water, and degreased in toluene vapor. These substrates were treated with an oxygen plasma for about one minute and coated with one nm fluorocarbon layer by plasma assisted deposition of $CHF_3$. The same procedure was used for preparing all other devices described in this invention.

These substrates were loaded into a deposition chamber for organic layers and cathode depositions.

The device of Example 1 was prepared by following the structure of OLED 300 as shown in FIG. 3 by sequential deposition of 150 nm NPB hole-transporting layer (HTL) doped with 2% DBzR yellow dopant, 20 nm blue light-emitting layer (LEL) comprising TBADN host with 2% TBP blue dopant, 35 nm Alq electron-transporting layer (ETL), and then 200 nm MgAg cathode. The above sequence completed the deposition of the OLED device.

TABLE 2

White emitting OLED device performance with Alq doping into the blue emission layer

| Device Number | Hole Transport Layer doped with yellow dopant | Blue emission layer Host (TBADN) | Blue layer dopant (TBP) | Blue layer dopant (Alq) | Electron transport layer thickness | Luminance Yield (cd/A) | CIE_x | CIE_y | Drive Voltage (volts) | Operational stability, T70 (Hours for 30% decrease in luminance) |
|---|---|---|---|---|---|---|---|---|---|---|
| 1 | 150 nm + 2.0% DBzR | 20 nm TBADN | 2% TBP | 0% Alq | 35 nm | 5.44 | 0.34 | 0.34 | 8.4 | 620 |
| 2 | 150 nm + 2.0% DBzR | 20 nm TBADN | 2% TBP | 1% Alq | 35 nm | 5.50 | 0.39 | 0.41 | 8.3 | 720 |
| 3 | 150 nm + 2.0% DBzR | 20 nm TBADN | 2% TBP | 2.5% Alq | 35 nm | 5.60 | 0.41 | 0.43 | 8.3 | 800 |
| 4 | 150 nm + 2.0% DBzR | 20 nm TBADN | 2% TBP | 5% Alq | 35 nm | 5.60 | 0.45 | 0.45 | 8.5 | 850 |
| 5 | 150 nm + 2.0% DBzR | 20 nm TBADN | 2% TBP | 10% Alq | 35 nm | 5.60 | 0.45 | 0.46 | 8.4 | 900 |
| 6 | 150 nm + 2.0% DBzR | 20 nm TBADN | 2% TBP | 25% Alq | 35 nm | 5.80 | 0.48 | 0.49 | 8.4 | 980 |

The OLED device was then "hermetically" packaged in a dry glove box filled with nitrogen for protection against ambient environment. The ITO patterned substrates used for preparing these OLED devices contained several test patterns. Each of the devices was tested for current voltage characteristics and the electroluminescence yield.

Devices of Examples 2 to 6 were prepared following structure of OLED 300 as shown in FIG. 3, and all the layers were similar except that the 20 nm (TBADN+2% TBP) blue emitting layer was doped with varying amounts of Alq concentrations varying from 1% to 25%. It was found that the devices of Examples 2 to 6 show an increase in luminance efficiency and an increase in the operational stability of the devices. However, the original white color of the device was shifted to the higher wavelength (and was more on the orange side). Device Example 1 shows the CIEx,y color coordinates of (0.34, 0.34), whereas device Example 3 with 2.5% Alq in the blue emitting layer has CIEx,y equal to (0.41, 0.43).

It was found that co-doping NPB and Alq could reduce this shift in the color of the spectra into the blue emitting layer along with the blue-emitting dopant. Simultaneously, the device luminance efficiency and the operational stability were improved. The operational stability of the encapsulated OLED devices in ambient environments was found by measuring the changes in the drive voltage and the luminance as a function of time when OLED devices were operated at a constant current density of 20 $mA/cm^2$.

co-dopant with TBP blue emitting dopant. It has luminance efficiency of 3.6 cd/A and CIEx,y=0.23, 0.36, respectively. This efficiency is higher than that of device Example 7, however the color is shifted toward green. Device Example 10 was prepared similar to device Example 7, except that the blue emitting layer contained 10% NPB and 10% Alq as co-dopants with TBP blue emitting dopant. It has luminance efficiency of 4.8 cd/A and CIEx,y=0.20, 0.25, respectively. The luminance efficiency of the device in Example 10 is higher than that of the devices of Examples 7, 8, and 9, and the color is similar to that of the device Example 7. Thus, higher luminance efficiency and good color was obtained when both Alq and NPB co-dopants were doped in the blue emitting layer along with blue emitting dopant TBP. This blue light-emitting layer doped with blue dopant and the blue stabilizing dopant materials of device Example 10 can be used to make white emitting OLED devices using the structure shown in FIG. 3.

TABLE 3

EL properties of Blue emitting OLEDs wherein the blue emitting layer is doped with dopants NPB and BAlq

| Device Number | Hole Transport Layer (undoped NPB layer thickness) | Blue emission layer Host (ADN) | Blue layer dopant 1 | Blue layer dopant 2 | Blue layer dopant 3 | Electron transport layer thickness | Luminance Yield (cd/A) | CIE_x | CIE_y | Drive Voltage (volts) |
|---|---|---|---|---|---|---|---|---|---|---|
| 7 | 150 nm | 20 nm ADN | 2% TBP | 0% NPB | 0% Alq | 25 nm | 3.35 | 0.16 | 0.23 | 6.3 |
| 8 | 150 nm | 20 nm ADN | 2% TBP | 10% NPB | 0% Alq | 25 nm | 4.18 | 0.16 | 0.23 | 6.2 |
| 9 | 150 nm | 20 nm ADN | 2% TBP | 0% NPB | 10% Alq | 25 nm | 3.60 | 0.23 | 0.36 | 6.0 |
| 10 | 150 nm | 20 nm ADN | 2% TBP | 10% NPB | 10% Alq | 25 nm | 4.80 | 0.20 | 0.25 | 6.4 |

Devices of Examples 7 to 10 given in Table 3 show the improvement from co-doping Alq and NPB dopants in blue OLED devices. Device Example 7 was prepared with the layer structure: 150 nm NPB HTL/20 nm A_DN host+2% TBP dopant as the blue emitting layer/25 nm Alq ETL/200 nm MgAg cathode. It has luminance efficiency of 3.35 cd/A, drive voltage 6.3 volts and CIEx,y=0.16, 0.23 respectively. Device Example 8 was prepared similar to device Example 7, except that the blue emitting layer has 10% NPB as a co-dopant with TBP blue emitting dopant. It has luminance efficiency of 4.18 cd/A, drive voltage 6.2 volts, and CIEx, y=0.16, 0.23, respectively. Thus, the efficiency of the device in Example 8 is higher than that of the device of Example 7. Device Example 9 was prepared similar to device Example 7, except that the blue emitting layer has 10% Alq as a Device Examples 11 to 15 (Table 4): Table 4 describes the use of other blue stabilizing co-dopants, such as NPB and BAlq, in the blue light-emitting layer of the white light-emitting devices. NPB is the hole-transporting blue stabilizing dopant, and BAlq is the electron-transporting blue stabilizing dopant in the blue light-emitting layer.

The device of Example 11 was prepared by following the structure of OLED 300 as shown in FIG. 3. By sequential deposition of 130 nm undoped NPB hole-transporting layer (HTL), 20 nm NPB HTL doped with 2% rubrene yellow dopant, 15 nm blue light-emitting layer (LEL) comprising TBADN host with 5% OP31 blue dopant (blue dopant formula B-1), and 10% NPB co-dopant, 35 nm Alq electron-transporting layer (ETL), and then 0.5 nm LiF/200 nm aluminum as the cathode. The above sequence completed the deposition of the OLED device.

TABLE 4

EL properties of White OLEDs wherein the blue emitting layer is doped with blue dopant and other dopants NPB or BAlq

| Device Number | Hole Transport sublayer 1 (undoped NPB layer thickness) | Hole Transport sublayer 2 doped with yellow dopant | Blue emission layer Host (TBADN) | Blue emission layer dopant 1 | Blue emission layer dopant 2 | Blue emission layer dopant 3 | Electron transport layer | Lum Yield (cd/A) | CIEx | CIEy | Drive Voltage | Operational stability |
|---|---|---|---|---|---|---|---|---|---|---|---|---|
| 11 | 130 nm | 20 nm NPB + 3.5% rubrene | 15 nm TBADN | 5% OP31 | NPB 10% | 0% | 25 nm Alq | 7.8 | 0.26 | 0.37 | 5.3 | 132 |
| 12 | 130 nm | 20 nm NPB + 3.5% rubrene | 15 nm TBADN | 5% OP31 | NPB 10% | 1% BAlq | 25 nm Alq | 8.2 | 0.31 | 0.40 | 5.5 | N.A. |

TABLE 4-continued

EL properties of White OLEDs wherein the blue emitting layer is doped with blue dopant and other dopants NPB or BAlq

| Device Number | Hole Transport sublayer 1 (undoped NPB layer thickness) | Hole Transport sublayer 2 doped with yellow dopant | Blue emission layer Host (TBADN) | Blue emission layer dopant 1 | Blue emission layer dopant 2 | Blue emission layer dopant 3 | Electron transport layer | Lum Yield (cd/A) | CIEx | CIEy | Drive Voltage | Operational stability |
|---|---|---|---|---|---|---|---|---|---|---|---|---|
| 13 | 130 nm | 20 nm NPB + 3.5% rubrene | 15 nm TBADN | 5% OP31 | NPB 10% | 3% BAlq | 25 nm Alq | 8.3 | 0.31 | 0.41 | 5.5 | 139 |
| 14 | 130 nm | 20 nm NPB + 3.5% rubrene | 15 nm TBADN | 5% OP31 | NPB 10% | 5% BAlq | 25 nm Alq | 8.4 | 0.32 | 0.41 | 5.5 | N.A. |
| 15 | 130 nm | 20 nm NPB + 3.5% rubrene | 15 nm TBADN | 5% OP31 | NPB 10% | 10% BAlq | 25 nm Alq | 8.7 | 0.33 | 0.42 | 5.6 | 164 |

Devices of Examples 12 to 15 were prepared following the structure of OLED 300 as shown in FIG. 3. All the layers were similar to the device in Example 11 except that the 15 nm (TBADN+5% OP31) blue emitting layer was co-doped with 10% NPB and varying amounts of BAlq concentrations varying from 1% to 10%. It was found that the devices of Example 12 to 15 show increased luminance efficiency and increased operational stability of the devices. The color of the white OLED was not significantly affected.

Devices of Examples 16 to 21 were prepared following the structure of OLED 300 as shown in FIG. 3. Device Example 16 is a control. It has a glass substrate, 85 nm ITO anode, and 0.5 nm $CF_X$ hole injection layer. Thereafter, a 130 nm NPB layer was deposited as the hole transport layer followed by 20 nm NPB layer doped with 2% DBzR. Then was deposited a 20 nm blue EML consisting of a TBADN host and 2.5% blue dopant B1, followed by 25 nm Alq and

TABLE 5

R, G, B characteristics of the White OLEDs after the color filter wherein the blue emitting layer is doped with blue dopants and other dopants NPB or Balq

| Device | Red color after color filter | | | Green color after color filter | | | Blue color after color filter | | | Predicted power (Watts) (Panel luminance 80 cd/m2 for 2.2" display, 0.44 polarizing transmission and |
|---|---|---|---|---|---|---|---|---|---|---|
| Number | Lum Yield (cd/A) | CIEx | CIEy | Lum Yield (cd/A) | CIEx | CIEy | Lum Yield (cd/A) | CIEx | CIEy | 0.42 aperature ratio) |
| 11 | 1.20 | 0.57 | 0.36 | 5.16 | 0.25 | 0.54 | 1.96 | 0.11 | 0.22 | 1.95 |
| 12 | 1.55 | 0.59 | 0.36 | 5.31 | 0.29 | 0.55 | 1.63 | 0.12 | 0.23 | 1.78 |
| 13 | 1.55 | 0.59 | 0.36 | 5.43 | 0.29 | 0.55 | 1.68 | 0.12 | 0.24 | 1.78 |
| 14 | 1.61 | 0.59 | 0.36 | 5.60 | 0.29 | 0.55 | 1.71 | 0.11 | 0.24 | 1.75 |
| 15 | 1.75 | 0.60 | 0.36 | 5.72 | 0.31 | 0.55 | 1.63 | 0.12 | 0.25 | 1.75 |

The luminance and the color data of the devices in Examples 11 to 15 given in Table 4 were used to predict the R, G, B color efficiency and the color when white light is passed through the R, G, B color filters. The power consumption on a 2.2" diagonal distance display was predicted at starting luminance of 80 cd/m2. It was found that the power consumption decreased from 1.95 watts to 1.75 watts. The stability of the device was simultaneously improved. This shows that the improvement in the luminance efficiency, reduction in power consumption, and improved lifetime was achieved by using NPB and BAlq co-dopants in the blue emitting layer along with a blue emitting dopant. Thus, white OLED devices can be prepared by following the different structures of this invention to have high performance and high operational stability.

cathode layers. This completed the device fabrication. The device was then encapsulated to protect it from moisture and environment. This device emitted white light. Device Examples 17 to 21 were prepared following the same procedure as control device Example 16, except that the blue emission layer had additional combinations of dopants as shown in Table 6. All of the layers for Devices 16 to 21 are the same except the blue emission layer. Device Examples 17 and 18 have a blue emission layer containing 5% and 10% Alq dopants along with the host and blue dopant B1. Device Example 19 has the blue emission layer containing 10% NPB dopant along with the host and blue dopant B 1. Device Examples 20 and 21 have the emission layers, which contain both Alq and NPB co-dopants along with the host and blue dopant B1.

TABLE 6

EL properties of White OLEDs wherein the blue emitting layer is doped with blue dopant and other dopants NPB or/and Alq

| Device Number | Hole Transport sublayer 1 (undoped NPB layer thickness) | Hole Transport sublayer 2 doped with yellow dopant | Blue emission layer Host (TBADN) | Blue emission layer dopant 1 (Dopant B1) | Blue emission layer dopant 2 | Blue emission layer dopant 3 | Electron transport layer | Lum Yield (cd/A) | CIEx | CIEy | Drive Voltage | Operational stability (Half-life at 70 degree C.) (hours) |
|---|---|---|---|---|---|---|---|---|---|---|---|---|
| 16 | 130 nm | 20 nm NPB + 2% DBzR | 20 nm TBADN | 2.5% Dopant B1 | 0% | 0% | 25 nm Alq | 5.5 | 0.33 | 0.38 | 7.5 | 400 |
| 17 | 130 nm | 20 nm NPB + 2% DBzR | 20 nm TBADN | 2.5% Dopant B1 | 0% | 5% Alq | 25 nm Alq | 5.5 | 0.44 | 0.47 | 8.0 | 700 |
| 18 | 130 nm | 20 nm NPB + 2% DBzR | 20 nm TBADN | 2.5% Dopant B1 | 0% | 10% Alq | 25 nm Alq | 5.9 | 0.46 | 0.48 | 7.7 | 750 |
| 19 | 130 nm | 20 nm NPB + 2% DBzR | 20 nm TBADN | 2.5% Dopant B1 | 10% NPB | 0% | 25 nm Alq | 5.1 | 0.29 | 0.33 | 7.8 | 350 |
| 20 | 130 nm | 20 nm NPB + 2% DBzR | 20 nm TBADN | 2.5% Dopant B1 | NPB 10% | 5% Alq | 25 nm Alq | 6.6 | 0.38 | 0.47 | 7.8 | 950 |
| 21 | 130 nm | 20 nm NPB + 2% DBzR | 20 nm TBADN | 2.5% Dopant B1 | NPB 10% | 10% Alq | 25 nm Alq | 6.8 | 0.39 | 0.48 | 7.6 | 1100 |

The luminance properties of the devices of Examples 16 to 21 are given in Table 6. The fade stability of these devices was measured at 70 degree centigrade temperature and at a constant average alternating (50% duty cycle) current density of 20 mA/cm$^2$. The fade stability of these devices is also included in Table 6. The data in Table 6 shows that the device Examples 20 and 21 have the highest luminance efficiency and the highest stability. This luminance level and the stability could not be obtained if either of the dopant Alq or NPB was co-doped along with the host and blue dopant B1 such as Example 17,18, or 19. Thus, the highest performing devices were prepared with the emission layer containing both the dopants and having hole transporting properties such as NPB and the dopant with electron transporting properties such as Alq provided in the blue emission layer containing the host and the blue dopant.

The invention has been described in detail with particular reference to certain preferred embodiments thereof, but it will be understood that variations and modifications can be effected within the spirit and scope of the invention. For example, multiple dopants can be used in any of the hole-transporting, electron-transporting, or light-emitting layers.

PARTS LIST

100 OLED with a simple structure
110 substrate
120 anode
140 light-emitting layer
170 cathode
200 OLED with a multilayer structure
210 light-transmissive substrate
220 light-transmissive anode
230 hole-injecting layer (HIL)
240 hole-transporting layer (HTL)
250 light-emitting layer (LEL)
260 electron-transporting layer (ETL)
270 cathode
300 OLED
310 substrate
320 light-transmissive anode
330 hole-injecting layer
340 hole-transporting layer
350 light-emitting layer
360 electron-transporting layer
370 cathode
400 OLED
410 substrate
420 anode
430 hole-injecting layer
441 hole-transporting sublayer
442 hole-transporting sublayer
450 light-emitting layer
460 electron-transporting layer
470 cathode
500 OLED
510 substrate
520 anode
530 hole-injecting layer
540 hole-transporting layer
550 blue light-emitting layer
561 electron-transport sublayer
562 electron-transport sublayer
570 cathode
600 OLED
610 substrate
620 anode
630 hole-injecting layer
640 hole-transporting layer
650 blue light-emitting layer
661 electron-transporting sublayer
662 electron-transporting sublayer
670 cathode
700 OLED
710 substrate
720 anode
730 hole-injecting layer
741 hole-transporting layer sublayer
742 hole-transporting layer sublayer
750 blue light-emitting layer
761 electron-transport sublayer
762 electron-transport sublayer
770 cathode
800 OLED
810 substrate
820 anode
830 hole-injecting layer
840 hole-transporting layer
850 light-emitting layer
861 electron-transport sublayer

862 electron-transport sublayer
870 cathode
900 OLED
910 substrate
920 anode
930 hole-injecting layer
941 hole-transport sublayer
942 hole-transport sublayer
950 blue light-emitting layer
961 electron-transport sublayer
962 electron-transport sublayer
970 cathode
1000 OLED
1010 substrate
1020 anode
1030 hole-injecting layer
1040 hole-transporting layer
1050 blue light-emitting layer
1061 electron-transporting sublayer
1062 electron-transporting sublayer
1063 electron-transporting sublayer
1070 cathode
1100 OLED
1110 substrate
1120 anode
1130 hole-injecting layer
1140 hole-transporting layer
1150 blue light-emitting layer
1161 electron-transport sublayer
1162 electron-transport sublayer
1163 electron-transport sublayer
1170 cathode
1200 OLED
1210 substrate
1220 anode
1230 hole-injecting layer
1241 hole-transporting layer sublayer
1242 hole-transporting layer sublayer
1250 blue light-emitting layer
1261 electron-transport sublayer 1
1262 electron-transport sublayer 2
1263 electron-transport sublayer 3

What is claimed is:

1. An organic light-emitting diode (OLED) device which produces white light, comprising:

a) an anode;

b) a hole-transporting layer disposed over the anode;

c) a blue light-emitting layer having a host doped with a blue light-emitting compound disposed directly on the hole-transporting layer and the blue light-emitting layer being doped with an electron-transporting or a hole-transporting material or both selected to improve efficiency and operational stability;

d) an electron-transporting layer disposed over the blue light-emitting layer;

e) a cathode disposed over the electron-transporting layer; and f) the hole-transporting layer or electron-transporting layer, or both the hole-transporting layer and electron-transporting layer, being selectively doped with a compound which emits light in the yellow region of the spectrum which is included in an entire layer or a partial portion of a layer in contact with the blue light-emitting layer.

2. The OLED device of claim 1 wherein hole-transporting or the electron-transporting material in the blue light-emitting layer is selected to be in a range of from 0.5 to 10 percent by volume of the host material and when both are used, they are selected to be in a range of from 1 to 20 percent by volume of the host material.

3. The OLED device of claim 1 wherein the hole-transporting material in the blue light-emitting layer is:

1,1-Bis(4-di-p-tolylaminophenyl)cyclohexane;

1,1-Bis(4-di-p-tolylaminophenyl)-4-phenylcyclohexane;

4,4'-Bis(diphenylamino)quadriphenyl;

Bis(4-dimethylamino-2-methylphenyl)-phenylmethane;

N,N,N-Tri(p-tolyl)amine;

4-(di-p-tolylamino)-4'-[4(di-p-tolylamino)-styryl]stilbene;

N,N,N',N'-Tetra-p-tolyl-4-4'-diaminobiphenyl;

N,N,N',N'-Tetraphenyl-4,4'-diaminobiphenyl;

N,N,N',N'-tetra-1-naphthyl-4,4'-diaminobiphenyl;

N,N,N',N'-tetra-2-naphthyl-4,4'-diaminobiphenyl;

N-Phenylcarbazole;

4,4'-Bis[N-(1-naphthyl)-N-phenylamino]biphenyl (NPB);

4,4'-Bis[N-(1-naphthyl)-N-(2-naphthyl)amino]biphenyl (TNB);

4,4"-Bis[N-(1-naphthyl)-N-phenylamino]p-terphenyl;

4,4'-Bis[N-(2-naphthyl)-N-phenylamino]biphenyl;

4,4'-Bis[N-(3-acenaphthenyl)-N-phenylamino]biphenyl;

1,5-Bis[N-(1-naphthyl)-N-phenylamino]naphthalene;

4,4'-Bis[N-(9-anthryl)-N-phenylamino]biphenyl;

4,4"-Bis[N-(1-anthryl)-N-phenylamino]-p-terphenyl;

4,4'-Bis[N-(2-phenanthryl)-N-phenylamino]biphenyl;

4,4'-Bis[N-(8-fluoranthenyl)-N-phenylamino]biphenyl;

4,4'-Bis[N-(2-pyrenyl)-N-phenylamino]biphenyl;

4,4'-Bis[N-(2-naphthacenyl)-N-phenylamino]biphenyl;

4,4'-Bis[N-(2-perylenyl)-N-phenylamino]biphenyl;

4,4'-Bis[N-(1-coronenyl)-N-phenylamino]biphenyl;

2,6-Bis(di-p-tolylamino)naphthalene;

2,6-Bis[di-(1-naphthyl)amino]naphthalene;

2,6-Bis[N-(1-naphthyl)-N-(2-naphthyl)amino]naphthalene;

N,N,N',N'-Tetra(2-naphthyl)-4,4"-diamino-p-terphenyl;

4,4'-Bis{N-phenyl-N-[4-(1-naphthyl)-phenyl]amino}biphenyl;

4,4'-Bis[N-phenyl-N-(2-pyrenyl)amino]biphenyl;

2,6-Bis[N,N-di(2-naphthyl)amine]fluorene;

1,5-Bis[N-(1-naphthyl)-N-phenylamino]naphthalene;

4,4',4"-tris[(3-methylphenyl)phenylamino]triphenylamine (MTDATA); or 4,4'-Bis[N-(3-methylphenyl)-N-phenylamino]biphenyl (TPD).

4. The OLED device of claim 1 wherein the electron-transporting materials in the blue light-emitting layer is:

BAlq;

Aluminum trisoxine [alias, tris(8-quinolinolato)aluminum(III)];

Magnesium bisoxine [alias, bis(8-quinolinolato)magnesium(II)];

Bis[benzo{f}-8-quinolinolato]zinc (II);

Bis(2-methyl-8-quinolinolato)aluminum(III)-$\mu$-oxo-bis(2-methyl-8-quinolinolato) aluminum(III);

Indium trisoxine [alias, tris(8-quinolinolato)indium];

Aluminum tris(5-methyloxine) [alias, tris(5-methyl-8-quinolinolato) aluminum(III)];

Lithium oxine [alias, (8-quinolinolato)lithium(I)];

Gallium oxine [alias, tris(8-quinolinolato)gallium(III)]; or

Zirconium oxine [alias, tetra(8-quinolinolato)zirconium (IV)].

5. The OLED device of claim 1 wherein the hole-transporting material is NPB and the electron-transporting material is Alq.

6. The OLED device of claim 1 wherein the hole-transporting material is NPB and the electron-transporting material is BAlq.

7. The OLED device of claim 1 wherein the yellow light-emitting compound is:

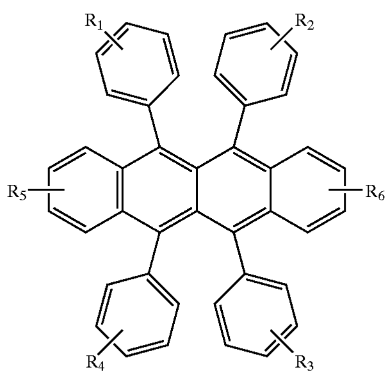

wherein $R_1$, $R_2$, $R_3$, $R_4$, $R_5$, $R_6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of phenyl, naphthyl, anthracenyl, phenanthryl, pyrenyl, or perylenyl;

Group 4: heteroaryl or substituted heteroaryl of from 5 to 24 carbon atoms such as thiazolyl, furyl, thienyl, pyridyl, quinolinyl or other heterocyclic systems, which may be bonded via a single bond, or may complete a fused heteroaromatic ring system;

Group 5: alkoxylamino, alkylamino, or arylamino of from 1 to 24 carbon atoms; or Group 6: fluorine, chlorine, bromine or cyano.

8. The OLED device of claim 6 wherein the yellow-emitting dopants includes 5,6,11,12-tetraphenylnaphthacene (rubrene); 6,11-diphenyl-5,12-bis(4-(6-methyl-benzothiazol-2-yl)phenyl)naphthacene (DBzR) or 5,6,11, 12-tetra(2-naphthyl)naphthacene (NR), the formulas of which are shown below:

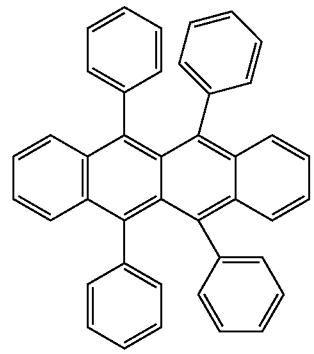

(rubrene)

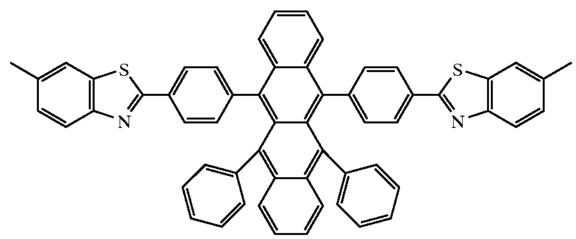

(DBzR)

or

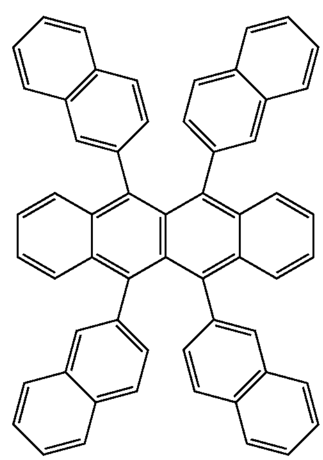

(NR)

9. The OLED device of claim 1 wherein the blue light emitting compound includes distyrylamine derivatives as shown by the formula

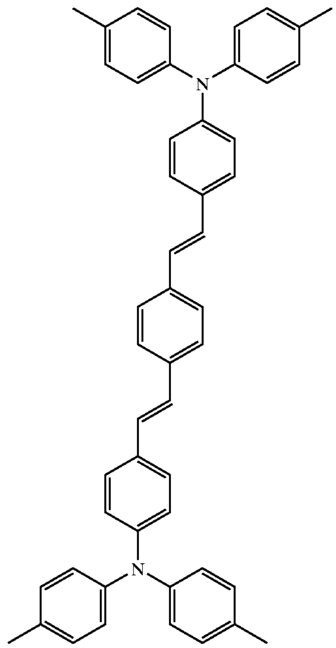
.

10. The OLED device of claim 1 wherein the blue emitting compound dopant further includes perylene and its derivatives.

11. The OLED device of claim 10 wherein the perylene derivative is 2,5,8,11-tetra-tert-butyl perylene (TBP).

12. The OLED device of claim 1 wherein the blue light emitting compound is represented by the following formulas:

B-2

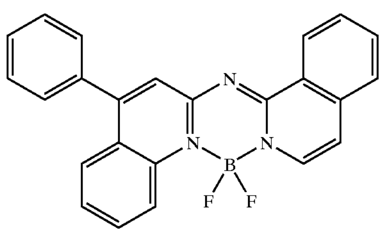
;

B-3

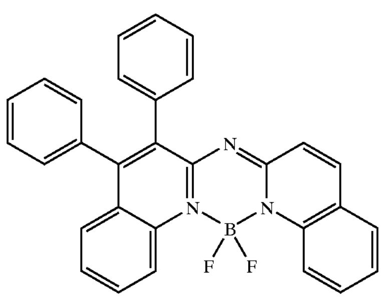
;

B-4

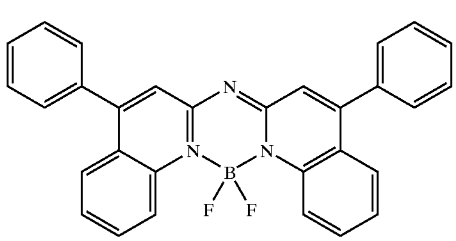
;

-continued

B-5

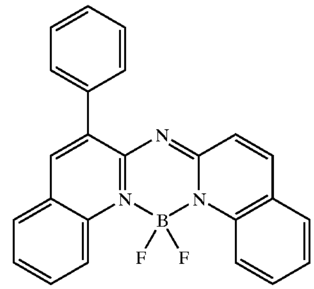
;

B-6

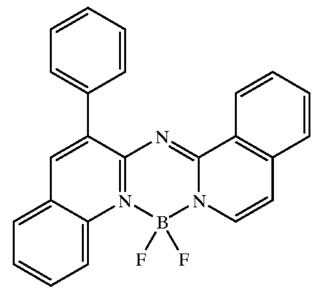
;

B-7

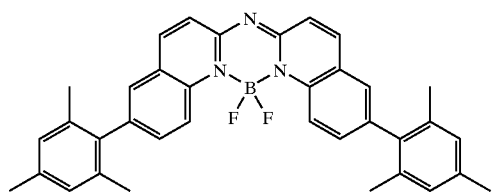
; and

B-8

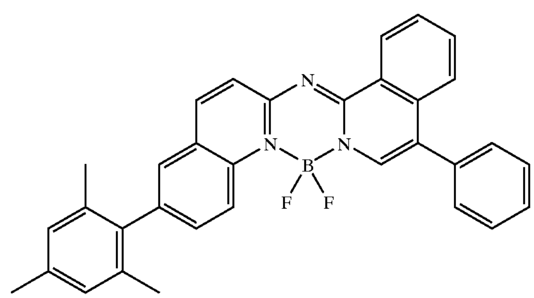
.

13. The OLED device of claim 1 wherein the concentration of blue emitting dopants, is in the range of greater than 0 and less than 10% percent by volume of the host material.

14. The OLED device of claim 1 wherein thickness of the hole-transporting layer is between 5 nm–300 nm.

15. The OLED device of claim 1 wherein the hole-transporting layer includes two or more sublayers, the sublayer closest to the blue light-emitting layer being doped with yellow-emitting dopants.

16. The OLED device of claim 15 wherein the dopant in the hole transport material is 5,6,11,12-tetraphenylnaphthacene (rubrene); 6,11-diphenyl-5, 12-bis (4-(6-methyl-benzothiazol-2-yl)phenyl)naphthacene (DBzR); or 5,6,11,12-tetra(2-naphthyl)naphthacene (NR), and the thickness of the layer containing yellow dopant is in a range between 1 nm–300 nm.

17. The OLED device of claim 1 wherein thickness of the blue light-emitting layer is in a range between 5 nm–100 nm.

18. The OLED device of claim 1 wherein a hole-injecting layer is provided between the anode and the hole-transporting layer.

19. The OLED device of claim 18 wherein the hole-injecting layer comprises CFx, CuPC, or m-MTDATA.

20. The OLED device of claim 18 wherein the thickness of hole injecting layer is 0.1 nm–100 nm.

21. The OLED device of claim 1 wherein thickness of the electron-transporting layer is in a range between 5 nm–150 nm.

22. The OLED device of claim 1 wherein the cathode is selected from the group consisting of LiF/Al, Mg:Ag alloy, Al—Li alloy, and Mg—Al alloy.

23. The OLED device of claim 1 wherein the cathode is transparent.

24. The OLED device of claim 1 wherein the electron-transporting layer is transparent.

25. The organic light-emitting diode (OLED) device of claim 1 wherein the electron-transporting layer is doped with a green light-emitting dopant or a combination of green and yellow light-emitting dopants.

26. The OLED device of claim 25 wherein of the green dopant in the electron-transporting layer includes a coumarin compound.

27. The OLED device of claim 26 wherein the coumarin compound includes C545T or C545TB.

28. The OLED device of claim 25 wherein the green light-emitting dopant is selected from the group consisting of:

G-1

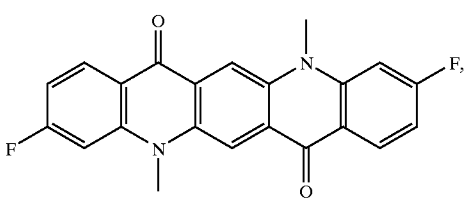

G-2

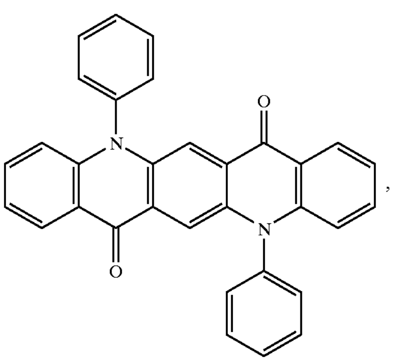

G-3

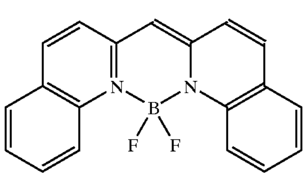

;

G-4

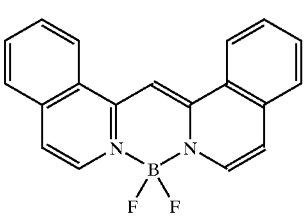

;

-continued

G-5

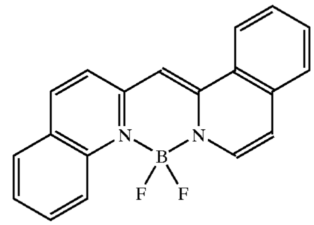

;

G-6

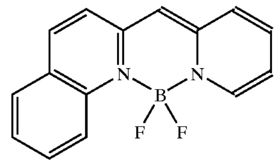

; and

G-7

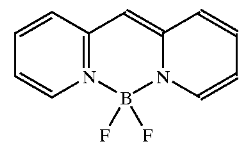

.

29. The OLED device of claim 25 wherein green dopant concentration is between 0.1–5% percent by volume of the electron transport material in the electron transporting layer.

30. The OLED device of claim 1 further including a buffer layer disposed on the cathode layer.

31. The OLED device of claim 30 wherein thickness of the buffer layer is in a range between 1 nm–1000 nm.

32. The OLED device of claim 1 further including a color filter array.

33. The OLED device of claim 1 wherein the hole-transporting layer includes an aromatic tertiary amine.

34. The OLED device of claim 1 wherein the electron-transporting layer includes copper phthalocyanine compound.

35. The OLED device of claim 1 wherein the blue light-emitting layer includes host material selected from the group consisting of:

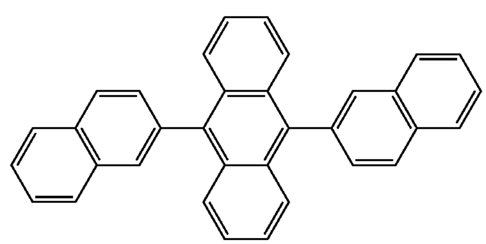

; and

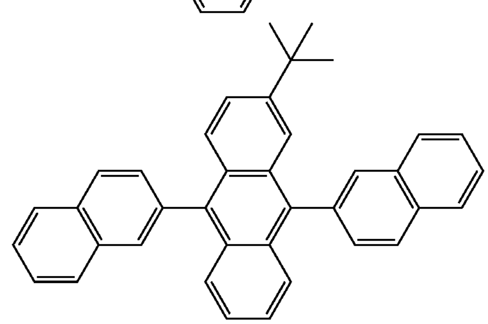

and wherein the blue light-emitting dopant includes
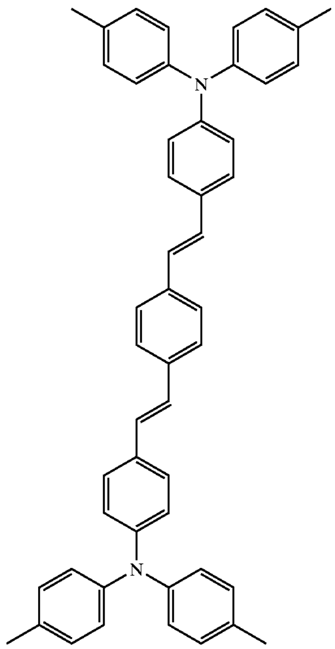
or derivatives thereof.
36. The OLED device of claim 3 wherein the blue light-emitting layer includes host material selected from the group consisting of:
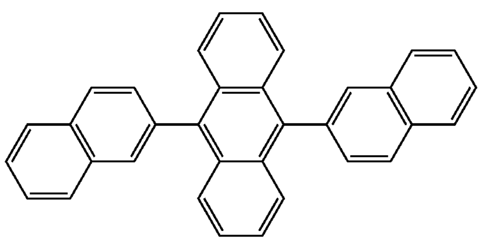
; and
-continued
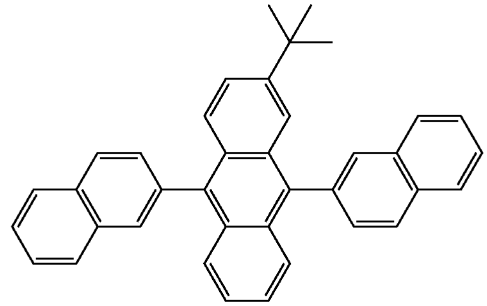
and wherein the blue light-emitting dopant includes
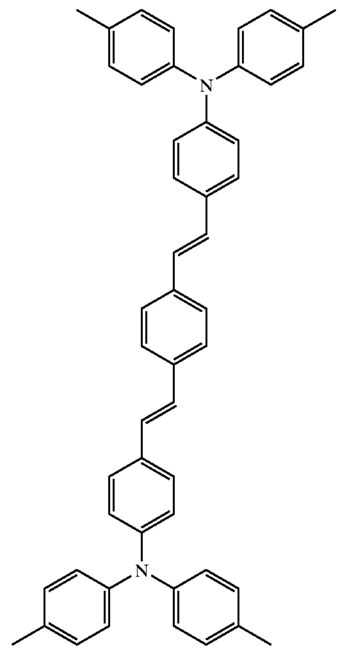
or derivatives thereof.
* * * * *